(12) United States Patent
Caudle et al.

(10) Patent No.: US 10,551,411 B2
(45) Date of Patent: Feb. 4, 2020

(54) SEMICONDUCTOR TEST SYSTEM WITH FLEXIBLE AND ROBUST FORM FACTOR

(71) Applicant: SILICON LABORATORIES INC., Austin, TX (US)

(72) Inventors: Scott E. Caudle, Austin, TX (US); Wenshui Zhang, Singapore (SG); Raymond A. Booher, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 153 days.

(21) Appl. No.: 15/892,931

(22) Filed: Feb. 9, 2018

(65) Prior Publication Data
US 2019/0250188 A1  Aug. 15, 2019

(51) Int. Cl.
*G01R 1/04* (2006.01)
*G01R 31/26* (2020.01)

(52) U.S. Cl.
CPC .......... *G01R 1/045* (2013.01); *G01R 1/0458* (2013.01); *G01R 31/2601* (2013.01)

(58) Field of Classification Search
CPC ... G01R 1/045; G01R 1/0458; G01R 31/2601
USPC ........... 324/750.28, 114, 76, 757.05, 762.06
See application file for complete search history.

(56) References Cited

U.S. PATENT DOCUMENTS

| | | | | |
|---|---|---|---|---|
| 5,592,222 A | * | 1/1997 | Nakamura | G11C 19/00 257/225 |
| 2005/0231855 A1 | * | 10/2005 | Tran | H01L 45/16 360/324.1 |
| 2010/0276572 A1 | * | 11/2010 | Iwabuchi | H01L 23/481 250/208.1 |

* cited by examiner

*Primary Examiner* — Giovanni Astacio-Oquendo
(74) *Attorney, Agent, or Firm* — Gary Stanford; James W. Huffman

(57) ABSTRACT

A test system for testing semiconductor chips including a docking plate, a test card, chip sockets, a stiffener, and test electronics. Each test card has a uniform card configuration that may be used with any of several different handlers. Each test card includes conductive pads electrically coupled to and longitudinally offset from a socket interface along a length of the test card. The stiffener includes a test interface including conductive pins for electrically interfacing the conductive pads of the test card. The test card is supported by the stiffener so that it remains undeformed as each chip is plunged into a test socket. The test interface includes a basin that is covered by the test card to form a thermal isolation cavity for thermal separation from the test electronics. A uniform radio frequency interface is provided between each test card and a corresponding test interface.

20 Claims, 15 Drawing Sheets

SEMICONDUCTOR TEST SYSTEM WITH FLEXIBLE AND ROBUST FORM FACTOR

BACKGROUND OF THE INVENTION

Field of the Invention

The present invention relates in general to semiconductor testing, and more particularly to a semiconductor test system with a flexible and robust form factor that may further include improved thermal isolation and radio frequency (RF) signal processing.

Description of the Related Art

In a basic test configuration, semiconductor chips to be tested are loaded into a handler, a test head configured to test the chips is mounted to or otherwise interfaced with the handler, and the handler delivers or plunges one or more chips at time onto the test head for performing test operations. The semiconductor chips may include a radio frequency (RF) interface. The test process may include heating or cooling the semiconductor chips to desired test temperatures. In conventional test configurations, custom production test hardware had to be designed for each specific handler and for each chip to be tested, also known as the device under test (DUT). Each handler, for example, is designed with a specific number of test sites having specific site spacing. The production test hardware included the test electronics mounted to a test interface with specific multisite spacing for a given handler and for a specific chip, in which the test equipment often could not be shared across different handlers even for the same chip begin tested. Thus, for each semiconductor chip to be tested, multiple test heads had to designed depending upon the particular handlers to be used for testing. For example, different multisite handlers are available with different multisite spacing, such as 2X, 4X, 8X, 16X, etc., in which a custom test head and test circuitry had to be designed for each hander.

Conventional test hardware that allowed for flexible form factors were not robust. Conventional test methods were mechanically unstable and required many hours of production downtime to achieve stable high yields across different multisite configurations. Each custom test head was typically implemented on a printed circuit board (PCB) with multiple test sites and with conventional test connectors that electrically interfaced each test site to the test electronics. The test connectors were usually aligned with the test sites and positioned between the PCB and the test electronics in direct line with plunge forces. Even if not placed in direct line with the plunge forces, the test PCB was often deformed in response to plunging force which caused stress on the test connectors. Repeated plunging of the chips onto the test head put significant stress on the test PCB and mechanically manipulated the test connectors. The test connectors wore out quickly thereby reducing overall test hardware lifetime.

The conventional test hardware typically required custom solutions for every different handler to perform testing under specified temperature conditions. The customized test apparatus, however, often did not exhibit thermal stability and did not provide adequate isolation of each chip in terms of heat distribution. For example, heat applied to the chip was usually siphoned on the other side of the test PCB providing an inefficient thermal solution. Furthermore, the conventional test apparatus did not provide uniform RF spacing between the RF interface and each chip test site. Thus, the RF signal paths to each of the multiple test sites on the test PCB were not uniform so that each individual test site required specialized calibration and tuning. This problem is compounded for multiple test PCBs having to be separately designed for each hander even for the same semiconductor chip being tested.

SUMMARY OF THE INVENTION

A test system for testing semiconductor chips according to one embodiment includes a docking plate, a number (M) of test cards, chip sockets, a stiffener, and test electronics. The docking plate includes multiple test site openings arranged as an array of at least one row and M columns, in which each test site opening receives a semiconductor chip for testing. Each test card has a uniform card configuration that may be used with any of several different handlers. An upper surface of each test card physically interfaces a lower surface of the docket plate and is aligned with a corresponding column. The test card includes at least one socket interface, each aligned with a corresponding test site opening, and also includes conductive pads electrically coupled to and longitudinally offset from the socket interface along a length of the test card. Each chip socket is interposed between the docking plate and a corresponding test card for electrically coupling pads of a semiconductor chip to a corresponding socket interface of the test card. The stiffener includes M test interfaces each including conductive pins for electrically interfacing the conductive pads of a corresponding test card. The test electronics are mounted at a lower surface of the stiffener and electrically interfaced with the conductive pins of each test interface for enabling electrical communication with the semiconductor chips.

In one embodiment, the M columns are separated by a handler specific distance that is unique for each of the different handlers. Each test card has a uniform configuration that may be used within a test system configured for any of the different handers. The at least one row may include two rows separated by a uniform distance that is common to each of the different handlers. The handlers may include, for example, a 4X handler, an 8X handler, and a 16X handler, each having a different handler specific distance between the M columns.

The lower surface of each test card may physically interfaces at least a portion of the upper surface of the stiffener so that when each semiconductor chip is pressed into a corresponding chip socket to correspondingly press against the upper surface of the test card, the test cards is supported by the stiffener and remains undeformed.

Each test card may be implemented as a printed circuit board (PCB) including a center section and first and second end sections integrally mounted on either end of the center section. First and second socket interfaces may be provided in the center section along the upper surface of the test card, and first and second sets of conductive pads may be provided on a lower surface of the first and second end sections, respectively, and electrically coupled to a corresponding one of the first and second socket interfaces. Each test interface of the stiffener may also include a center section and first and second end sections positioned on either end of the center section. Also, a corresponding basin may be formed on the upper surface of the stiffener within the center section of each test interface. In this manner, the center section of each test cards covers the basin of a corresponding test interface so that the basin forms a thermal isolation cavity. Heat seal gaskets may be provided around each basin. Also, each test card may have a width that is greater than a width of each basin so that a lower surface of the center section of each test card is physically supported by at least a portion of the stiffener at a periphery of a corresponding basin so that each test card remains substantially undeformed when the semiconductor chips are plunged into the test site openings.

At least one radio frequency connector may be mounted near a middle of the center section of each test card and electrically coupled to a socket interface. Also, at least one radio frequency connector may be mounted within a corresponding basin near a middle of the center section of a corresponding test interface that is mated with a radio frequency connector of a corresponding test card. The radio frequency connectors may be implemented as a pair of connectors, such as an input/output pair.

A test head for testing at least one semiconductor chip received from a selected one of multiple different handlers according to one embodiment may include a purge box, a stacked configuration, and test electronics. The stacked configuration may include a stiffener, a test card, a socket interface, a docking plate, and a chip socket as described herein.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the need to consolidate test equipment design for testing the same semiconductor chip using multiple handlers, to provide a more robust and efficient test configuration for each handler, and to provide a more efficient test solution in terms of thermal isolation and RF signal processing. They have therefore developed a semiconductor test system with a more flexible and robust form factor as further described herein. The test PCB is embedded within a stacked configuration between a docking plate and stiffener so that it not substantially deformed during plunge forces. Also, the test connectors are longitudinally offset from the socket interface(s) receiving the semiconductor chips and thus are minimally impacted by the plunge forces providing robustness and longevity. The test PCB has a uniform configuration that may be used with any one of multiple handlers. The test PCB physically and electrically interfaces a test interface incorporating a basin forming a thermal isolation cavity in the stacked configuration, so that each chip under test and the test PCB are both thermally isolated from cooling temperatures of the underlying test electronics. Each test PCT and corresponding test interface incorporates radio frequency connectors in a common and uniform fashion with uniform spacing for each different handler configuration avoiding additional specialized calibration and tuning.

Figure 1:
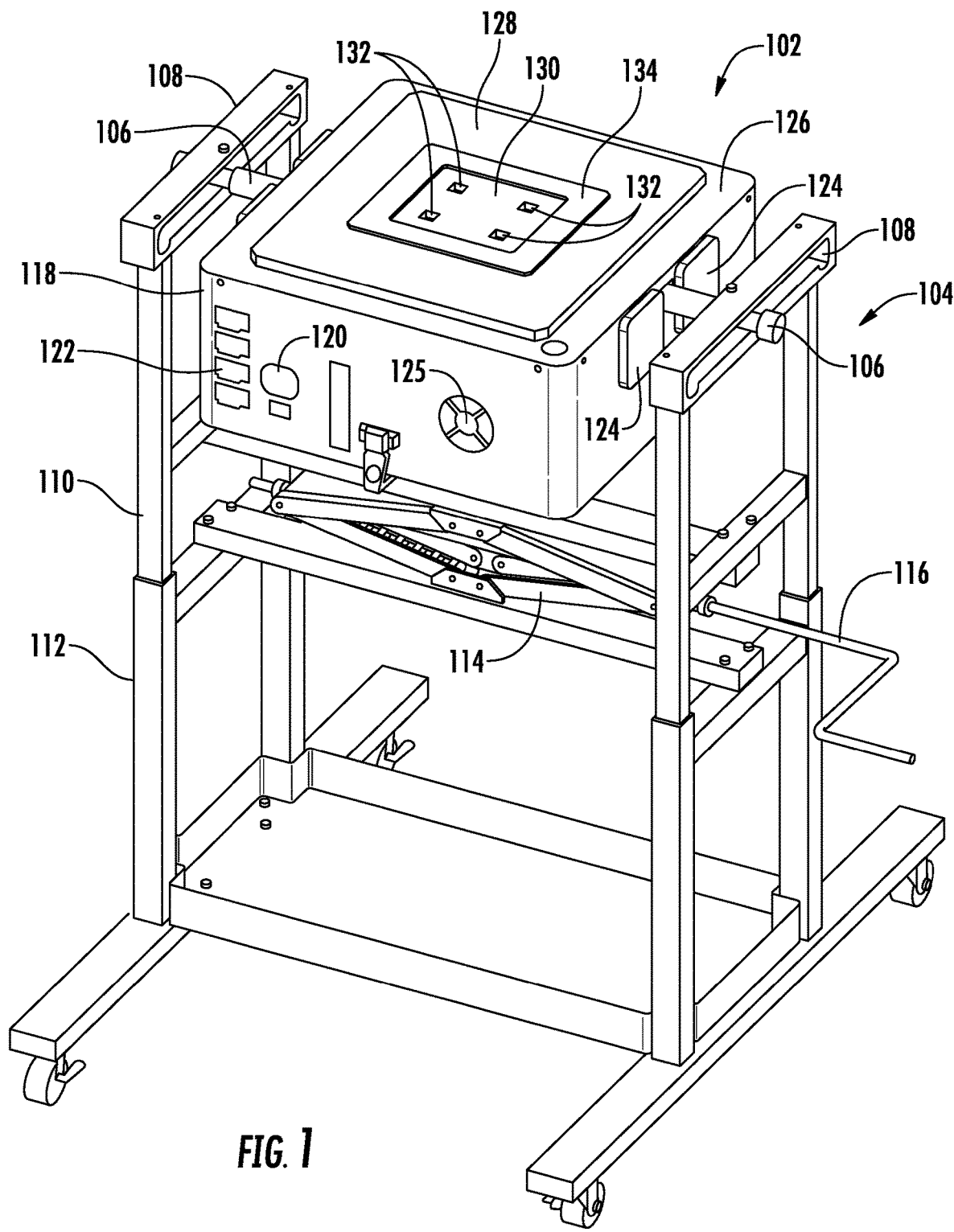
FIG. 1 is a perspective view of a test head implemented according to one embodiment of the present invention mounted to a carrier cart.

FIG. 1 is a perspective view of a test head 102 implemented according to one embodiment of the present invention mounted to a carrier cart 104. The carrier cart 104 enables transport of the test head 102 within a test area, such as to and from a 4X handler 202 (FIG. 2) for testing semiconductor chips 401 (FIG. 4) for which the test head 102 is designed. A pair of elongated round handles 106 with screw-off end caps are mounted on either side of the test head 102 for insertion into opposing slots 108 of an upper support 110 of the carrier cart 104. The interface between the handles 106 and the slots 108 enable the test head 102 to be manipulated into a desired test position and orientation. Although not specifically shown, removable pins may be inserted through the top of the slots 108 and into the round handles 106 in order to lock the test head into selected rotation positions, such as at 0, 90, 270, or 360 degrees. The carrier cart 104 includes a lower support 112 including a scissor jack 114 and jack crank 116. In the illustrated configuration, the upper support 110 includes vertical arms that are inserted into corresponding vertical arms of the lower support 112 providing a telescoping configuration for raising or lowering the test head 102. The slots 108 are formed at the upper end of the vertical arms of the upper support 110. The scissor jack 114 is mounted to supporting brackets of the lower support 112 and the upper support 110 and the jack crank 116 is manipulated (e.g., turned or cranked) for raising and lowering the test head 102.

The test head 102 is configured as a rectilinear-shaped purge box 118 having an internal space that contains test electronics 1002 (FIG. 10) described further herein. The purge box 118 includes an alternating-current (AC) receptacle 120 for receiving and providing AC power and one or more communication ports 122 for communicating with an external test controller (not shown), such as a computer or the like executing test software. The communication port 122 may of any type, such as a Universal Serial Bus (USB) connector and interface or the like that provides communication between the test electronics 1002 and the external test controller. The purge box 118 also includes multiple fan ports 124 for providing ventilation to the test electronics 1002 contained therein. A fan or the like (not shown) may be mounted within the purge box 118 at each fan port 124 to establish airflow during testing, such as at least one fan to pull air into the purge box 118 and at least one additional fan to push air out. Generally, heat generated by the test electronics 1002 is purged from the purge box 118 during test operations. Also, a power supply fan 125 may be provided for an internal power supply (not shown) providing power to the test electronics 1002 contained within the purge box 118.

Figure 15:
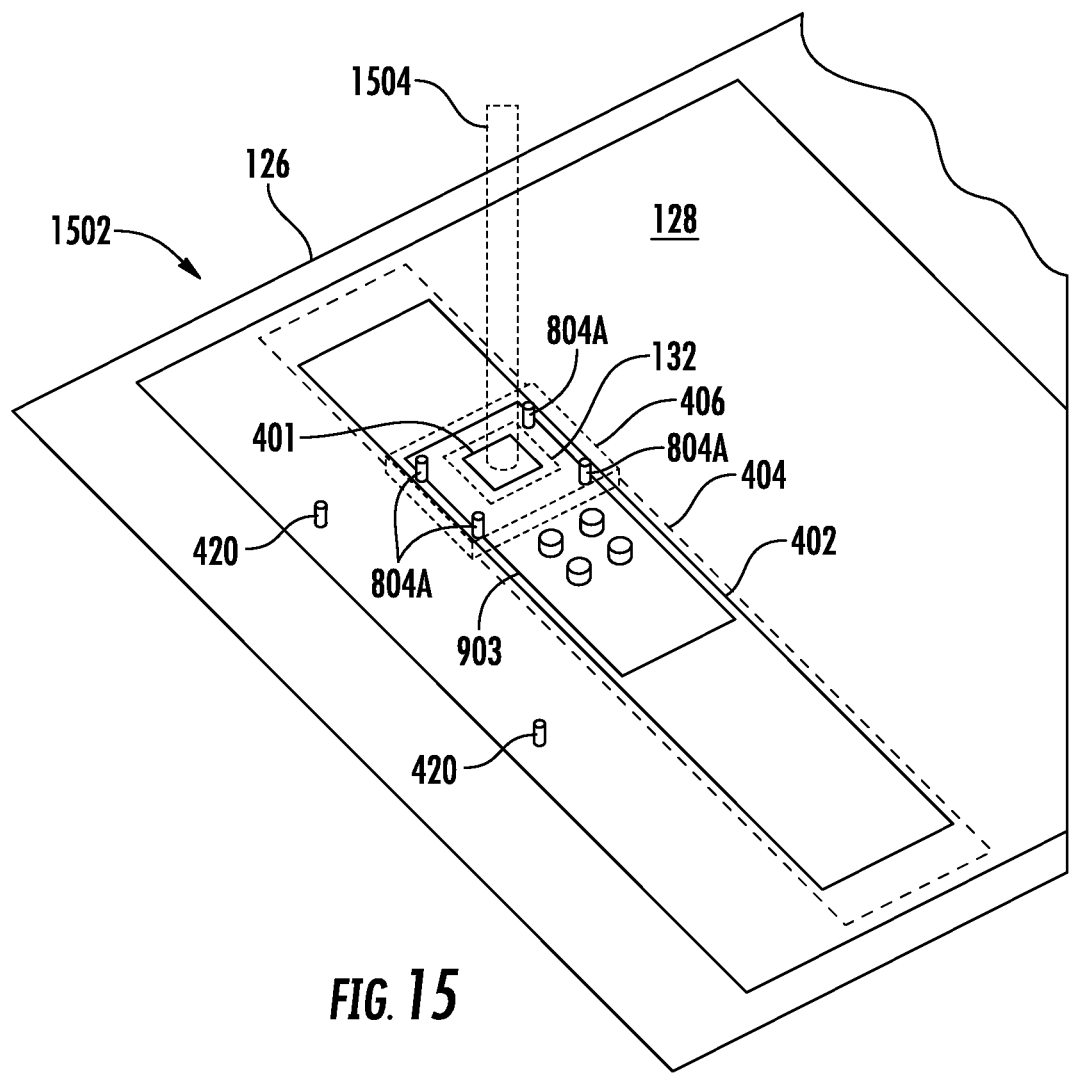
FIG. 15 is a partial perspective view of a stacked configuration implemented according to one embodiment of the present invention including the docking plate, a corresponding one of the chip sockets, and one of the test cards mounted to a corresponding one of the test interfaces of the stiffener of FIGS. 1 and 4.

A stiffener 126 is mounted as the upper surface of the purge box 118, and a docking plate 128 is mounted onto the upper surface of the stiffener 126 in a stacked configuration 1502 (FIG. 15). The illustrated docking plate 128 is configured with a test area 130 including four (4) test site openings 132 according to a 4X configuration for receiving up to 4 of the semiconductor chips 401 at a time from a 4X handler for testing, such as the 4X handler 202 shown in FIG. 2. The test area 130 may be provided within a slightly elevated platform 134 for interfacing the 4X handler 202. As described further herein, the test head 102 may be alternatively configured according to a 2X configuration, an 8X configuration, a 16X configuration, etc. The 2X configuration receives up to 2 semiconductor chips 401 at a time from a 2X handler or for desktop testing, the 4X configuration receives up to 4 semiconductor chips 401 at a time from a 4X handler for testing, the 8X configuration receives up to 8 semiconductor chips 401 at a time from a 8X handler (not shown) for testing, and the 16X configuration receives up to 16 semiconductor chips 401 at a time from a 16X handler (not shown) for testing. For each of the different configurations, the purge box 118 is essentially the same, although the stiffener 126 and the docking plate 128 are reconfigured according to the number of test sites 130 for each of the different configurations as further described herein. The internal test electronics 1002 for each test site are the same and duplicated for each pair of the test sites 130.

Figure 2:
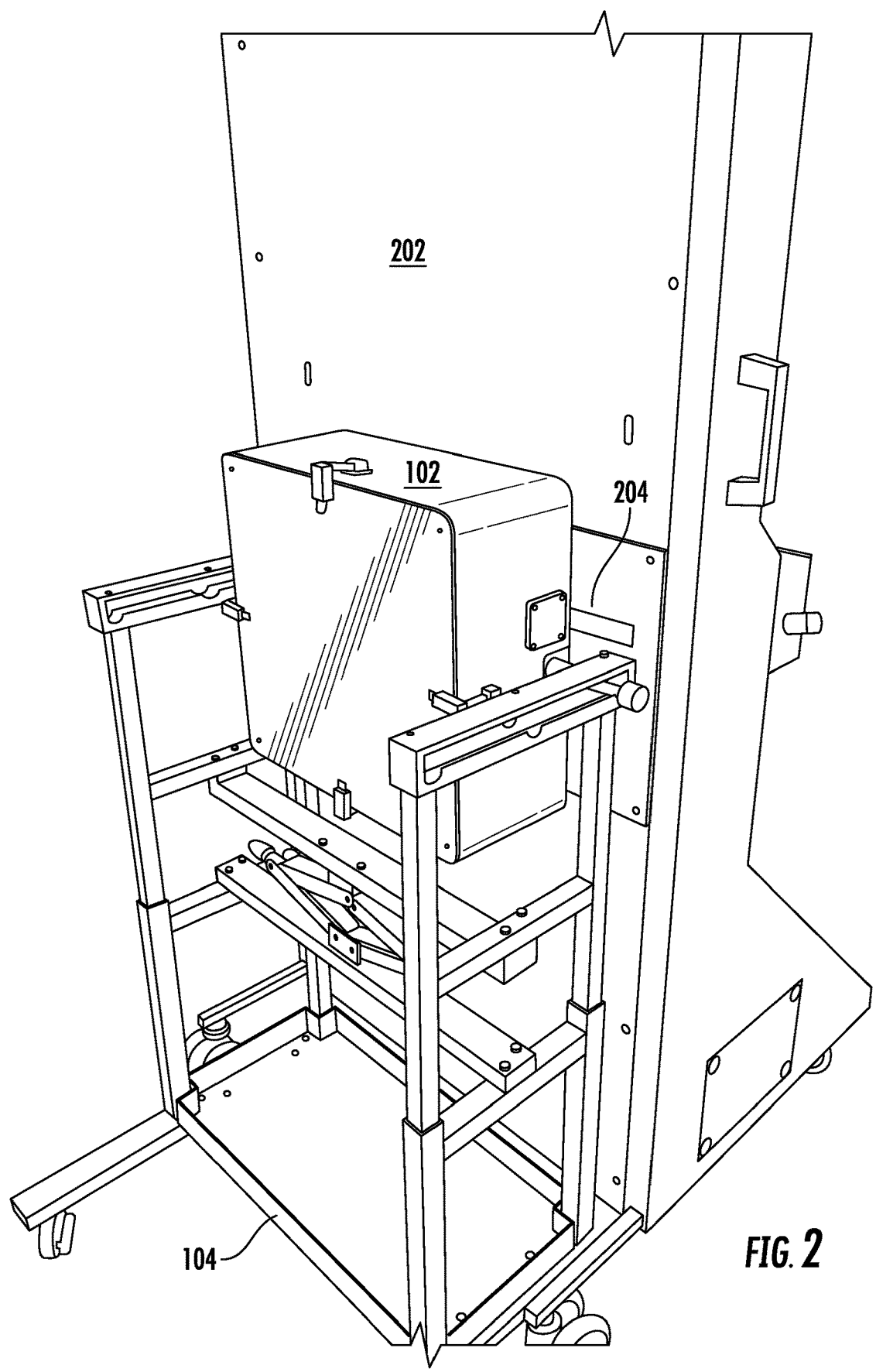
FIG. 2 is a perspective view of the test head mounted on the carrier cart of FIG. 1 and oriented and positioned to interface a 4X handler according to a vertical dock configuration.

FIG. 2 is a perspective view of the test head 102 mounted on the carrier cart 104 and oriented and positioned to interface the 4X handler 202 according to a vertical dock configuration. As shown, the test head 102 has been rotated 90 degrees from its upright position and slid within the slots 108 towards the 4X handler 202 so that the docking plate 128 at the top surface of the test head 102 interfaces a corresponding docking interface 204 of the 4X handler 202. Although not specifically shown, alignment pins may be provided on the docking plate 128 to align with corresponding alignment holes of the docking interface 204 for purposes of alignment during testing. In the vertical dock configuration, the semiconductor chips to be tested (e.g., chips 401) are loaded into the corresponding handler. Although not shown, horizontal dock handlers are also known in which the test head 102 remains in the horizontal position shown in FIG. 1.

Figure 3:
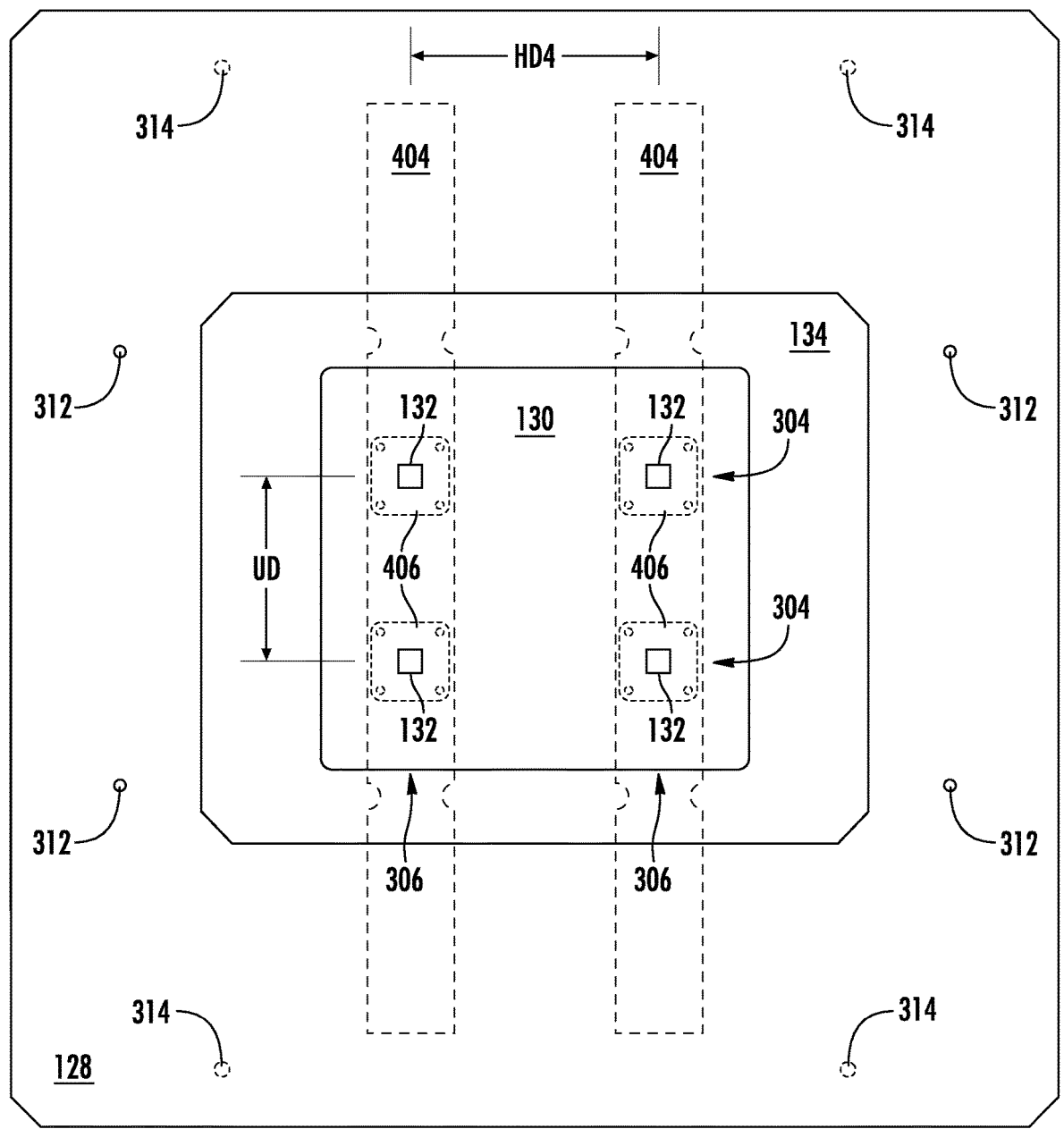
FIG. 3 is an orthogonal top view diagram of the docking plate of FIG. 1 for the 4X configuration according to one embodiment of the present invention.

FIG. 3 is an orthogonal top view diagram of the docking plate 128 for the 4X configuration according to one embodiment of the present invention. The docking plate 128 includes an array of 4 test site openings 132 within the test area 130 (inside the elevated platform 134), in which the test site openings 132 are organized as two rows 304 and two columns 306 of test site openings 132. The rows 304 are aligned with each other and spaced apart by a uniform row distance UD suitable for multiple handlers. Each of the configurations shown and described include two rows, but it is understood that a single row is contemplated, or even more than two rows, such as four rows for more complex configurations. Each column 306 includes a pair of test site openings 132, and the columns 306 are spaced apart from each other by a handler specific column distance HD4 for the 4X configuration. The handler specific column distance HDX is different for the different configurations, in which "X" denotes the particular configuration. In other words, the handler specific column distance is HD4 for the 4X configuration, is HD8 for the 8X configuration, and is HD16 for the 16X configuration. In this manner, the 4X, 8X and 16X configurations each include two rows separated by the uniform distance UD, with a number of columns separated by a handler specific distance HDX that depends upon the particular configuration as described further herein. Multiple handler spacing dimensions are possible even for the same site count configurations to account for different handler equipment requirements.

Each test site opening 132 is generally rectangular in shape for receiving a corresponding one of the semiconductor chips 401 for testing. The docking plate 128 interfaces the 4X handler 202 to expose the test site openings 132 within the test area 130 to the operative portions of the 4X handler 202, and the 4X handler 202 "plunges" each of one or more semiconductor chips 401 into a corresponding test site opening 132 for testing. A dashed line rectangular-shaped box aligned in each column 306 indicates the relative position of a test printed circuit board (PCB) or "test card" 404 (FIG. 4) located beneath the docking plate 128 as further described herein. Also, a pair of dotted-line square-shaped boxes aligned with the test site openings 132 in each of the columns 306 indicates the relative position of a chip socket 406 (FIG. 4) located beneath the docking plate 128 and interposed between a corresponding test card 404 and the docking plate 128 as further described herein. The docking plate 128 further includes multiple bolt holes 312 for mounting to the stiffener 126. Four such bolt holes 312 are shown, although any suitable number in any suitable position may be included. The docking plate 128 further includes one or more alignment pins 314 for aligning the docking plate 128 with the stiffener 126 (show with dashed lines as mounted on the lower surface of the docking plate 128). Again, four such alignment pins 314 are shown, although any suitable number in any suitable position may be included.

Figure 4:
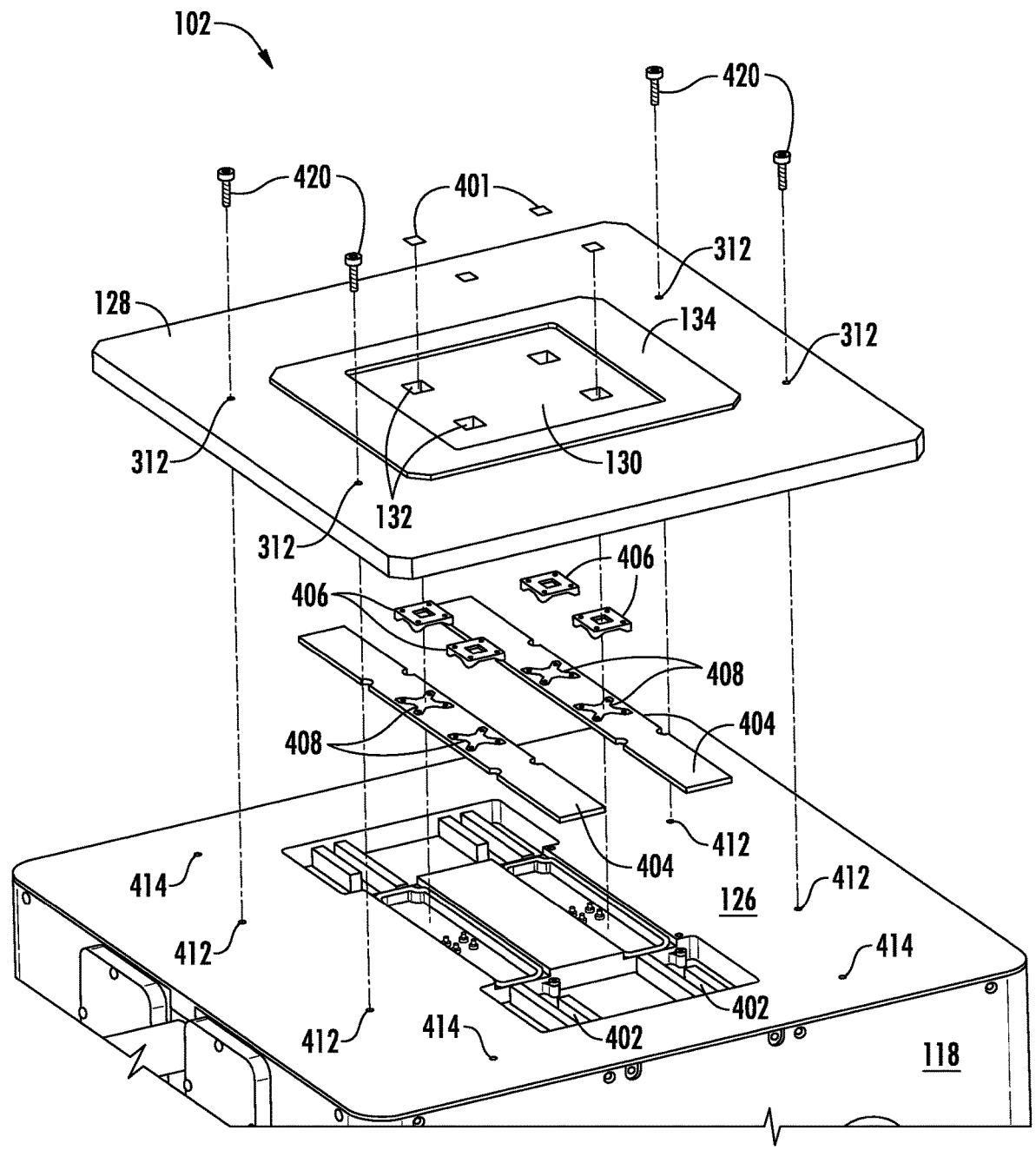
FIG. 4 is an exploded perspective view illustrating construction of the test head between the docking plate and the stiffener of FIG. 1 for the 4X configuration with 4 test site openings according to one embodiment of the present invention for testing up to 4 of the same semiconductor chips at a time by the 4X handler.

FIG. 4 is an exploded perspective view illustrating construction of the test head 102 between the docking plate 128 and the stiffener 126 for the 4X configuration with 4 test site openings 132 according to one embodiment of the present invention for testing up to 4 of the same semiconductor chips 401 at a time by the 4X handler 202. A pair of electrical-mechanical (E/M) test interfaces 402 are implemented on the upper surface of the stiffener 126, including one test interface 402 for each of the two columns 306 of the test site openings 132 of the docking plate 128. Thus, each test interface 402 encompasses and interfaces two of the test site openings 132. Also, a pair of test cards 404 are provided, including one test card 404 for each of the test interfaces 402 so that each test card 404 also encompasses and interfaces two of the test site openings 132. Further, a chip socket 406 is provided for each test site opening 132, so that a pair of the chip sockets 406 are provided for each test card 404 and each corresponding test interface 402.

In the stacked configuration 1502, each chip socket 406 is aligned with a corresponding test site opening 132 and mounted to the lower surface of the docking plate 128, and each pair of the chip sockets 406 within a corresponding one of the test site columns 306 is sandwiched or interposed between the lower surface of the docking plate 128 and the upper surface of a corresponding one of the test cards 404. The upper surface of each test card 404 includes a socket interface 408 that interfaces a test card interface 602 (FIG. 6) implemented on a lower surface of a corresponding one of the chip sockets 406. The lower surface of each test card 404 aligns with and interfaces a corresponding one of the test interfaces 402. The lower surface of the docking plate 128 is mounted to the upper surface of the stiffener 126 sandwiching the test cards 404 and chip sockets 406 therebetween. The 4X configuration includes two test interfaces 402, two corresponding test cards 404 and 4 chip sockets 406 for the four test site openings 132. The 2X configuration only includes one test interface 402 and one corresponding test card 404 with two chip sockets 406. The 8X configuration, shown in FIG. 11, handles twice the number of chips 401 as the 4X configuration including four test interfaces 402, four corresponding test cards 404 and 8 chip sockets 406 for eight test sites openings 132, in which the handler specific distance HD8 is modified accordingly. Similarly, the 16X configuration, shown in FIG. 13, handles twice the number of chips 401 as the 8X configuration including eight test interfaces 402, eight corresponding test cards 404 and 16 chip sockets 406 for 16 test site openings 132, in which the handler specific distance HD16 is modified accordingly.

The docking plate 128 is mounted to the stiffener 126 in any suitable manner. As shown, for example, several bolts 420 are inserted through respective ones of the bolt holes 312 and screwed into corresponding bolt holes 412 provided on the upper surface of the stiffener 126. The stiffener 126 further includes alignment holes 414 for receiving the alignment pins 314 provided on the lower surface of the docking plate 128. The illustrated bolts, bolt holes, alignment pins, and alignment holes are shown for purposes of illustration in which any suitable number and locations may be used. In any event, the docking plate 128 is properly aligned with and securely fastened to the stiffener 126 with suitable alignment and fastening mechanisms.

Figure 5:
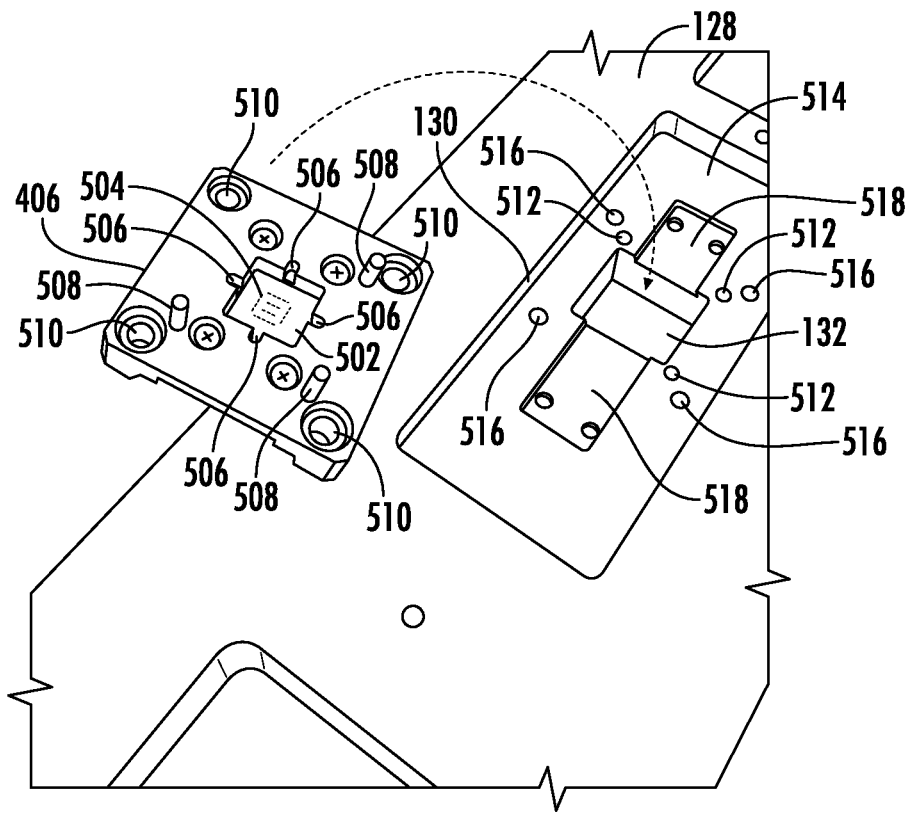
FIG. 5 is a perspective view of the chip socket of FIG. 4 more clearly showing details of its upper surface and a perspective view of a lower surface of the docking plate at a corresponding one of the test site openings according to one embodiment of the present invention.

FIG. 5 is a perspective view of the chip socket 406 more clearly showing details of its upper surface and a perspective view of a lower surface of the docking plate 128 at a corresponding one of the test site openings 132 according to one embodiment of the present invention. A rectangular-shaped chip insertion socket 502 is formed at approximately the center of the upper surface of the chip socket 406. The bottom surface of the chip insertion socket 502 includes a chip interface 504 that interfaces corresponding conductive pins of the semiconductor chip 401 when inserted into the chip insertion socket 502. Multiple ventilation holes 506 (e.g., air holes) are formed along the side edges of the chip insertion socket 502 that extend through the chip socket 406 for ventilation in and around the semiconductor chip 401 during testing. Multiple alignment pins 508 extend through the chip socket 406 between its upper and lower surfaces. In the illustrated embodiment, three alignment pins 508 are included, each positioned along a diagonal between a corner of the chip insertion socket 502 and a corresponding corner of the chip socket 406. It is noted that one of the four corners excludes an alignment pin for purposes of providing an alignment key for proper orientation of the chip socket 406 when inserted into the docking plate 128 as further described herein. Also, along the same diagonal lines and at all four corners, four bolt holes 510 extend through the body of the chip socket 406 for mounting and physically securing each chip socket 406 between a corresponding test card 404 and the docking plate 128.

Each test site opening 132 extends all the way through the docking plate 128 between its upper and lower surfaces. Three alignment holes 512 are provided just outside of three corners of the test site opening 132 which are adapted for receiving the alignment pins 508 when the chip socket 406 is flipped over and inserted at the lower surface of the docking plate 128 in alignment with the test site opening 132. The lower surface of the docking plate 128 around the test site opening 132 includes a socket well 514 having a width that is slightly greater than the width of the chip socket 406 for physically securing the chip socket 406 when inserted. Also, the depth of the socket well 514 is configured to be about the same as the width of the chip socket 406. Four bolt holes 516 are provided through the docking plate 128 in the socket well 514 outside the four corners of the test site opening 132 which align with the four bolt holes 510 provided through the chip socket 406 when mounted to the docking plate 128. In addition, an elongated ventilation channel 518 is provided within the socket well 514 on either side of the test site opening 132 to allow fluid communication (e.g., air) through the test site opening 132 from the 4X handler 202 to the chip 401 and to either side of the chip 401 and around and to the lower surface of the chip socket 406 during testing.

Figure 6:
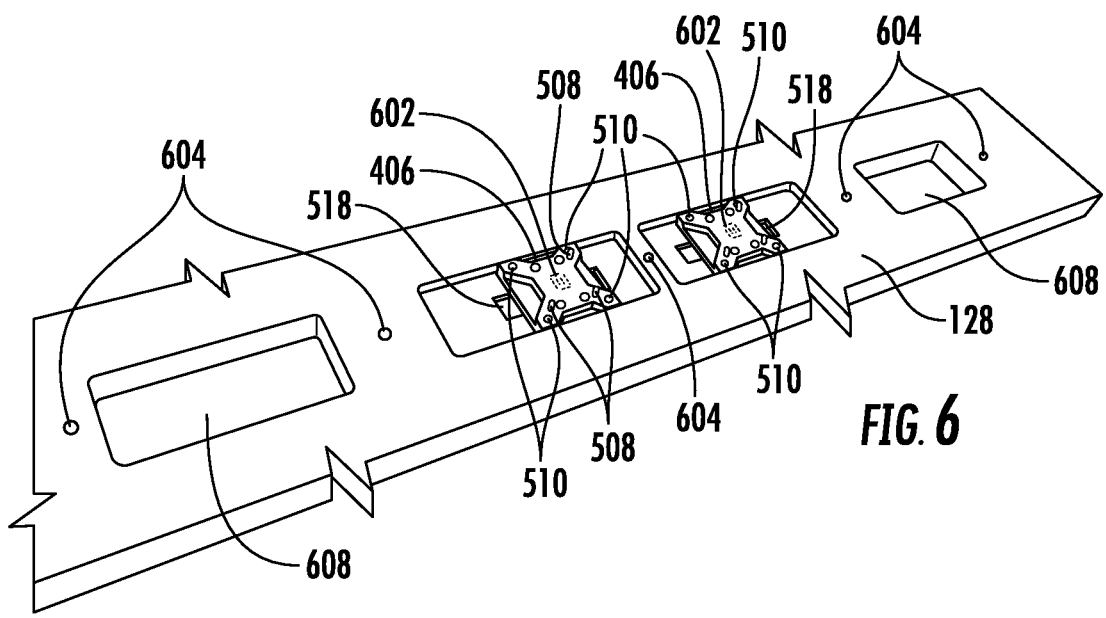
FIG. 6 is a perspective view of the lower surface of the docking plate of FIG. 1 showing a pair of the chip sockets inserted into the corresponding pair of socket wells and positioned in alignment with the corresponding pair of test site openings.

FIG. 6 is a perspective view of the lower surface of the docking plate 128 showing a pair of the chip sockets 406 inserted into the corresponding pair of socket wells 514 and positioned in alignment with the corresponding pair of test site openings 132. The lower surfaces of each of the chip sockets 406 show the four bolt holes 510 that are aligned with the four screw holes 516 of the docking plate 128 for mounting. Also shown are the ventilation channels 518 extending from either side of each of the chip sockets 406 for fluid communication. Each of the three alignment pins 508 of each chip socket 406 extends through the body of the chip socket 406 from the upper surface to extend below the lower surface for alignment with corresponding alignment holes 706 (FIG. 7) of a corresponding one of the test cards 404. The lower surface of each of the chip sockets 406 includes a corresponding test card interface 602 electrically coupled to the chip interface 504 provided on the upper surface of each chip socket 406. Although not explicitly shown in FIG. 6, the ventilation holes 506 extend through to the lower surface of to the chip socket 406 for thermal distribution. A linear array of bolt holes 604 are provided on the docking plate 128 for mounting the test card 404 to the docking plate 128 as further described herein. Two open application areas 608 are provided on the test card 404 for customized circuitry to be added uniquely for each test card design specific to aiding the functional testing of the chip 401.

Although not explicitly shown, the chip interface 504 on the upper surface and the test card interface 602 on the lower surface of each chip socket 406 may be implemented with an array of pogo pins mounted within the body of the chip socket 406. Each pogo pin may be implemented as a cylindrical body with a conductive contact pin on either end electrically coupled to each other. One or both contact pins may be spring-loaded having a relatively sharp end for making electrically conductive contact with a pin or pad. In this manner, one end of each pogo pin forming the chip interface 504 electrically interfaces a corresponding pin of the semiconductor chip 401 to electrically couple the corresponding pin to the other end of the corresponding pogo pin of the test card interface 602.

Figure 7:
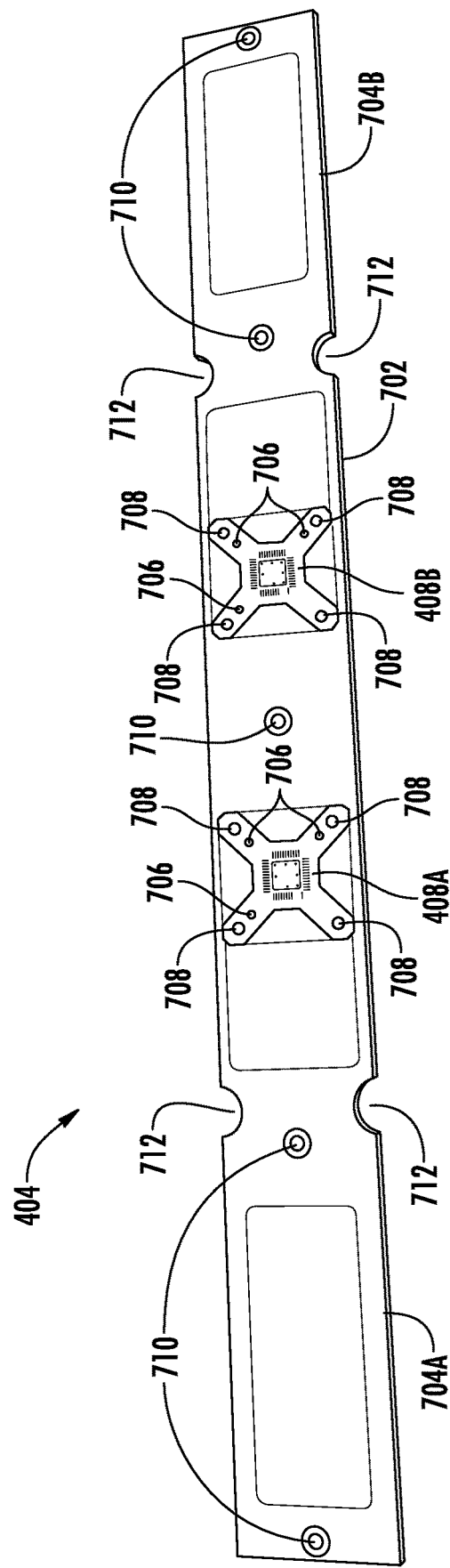
FIG. 7 is perspective view of the upper surface of the test card of FIG. 4 according to one embodiment of the present invention.

FIG. 7 is perspective view of the upper surface of the test card 404 according to one embodiment of the present invention. The test card 404 is a printed circuit board (PCB) that includes a center section 702 and two end sections 704A and 704B integrally formed on either side of the center section 702. The center section 702 is separated from each of the two end sections 704A and 704B by a pair of alignment notches 712. The center section 702 of the test card 404 further includes a pair of the socket interfaces 408, individually shown as socket interfaces 408A and 408B, for interfacing two corresponding chip sockets 406. Each of the socket interfaces 408A and 408B include an array of conductive pads for interfacing and electrically coupling to corresponding conductive pins of the test card interface 602 of a corresponding chip socket 406. As previously described, the chip socket 406 may incorporate an array of pogo pins, so that when the semiconductor chip 401 is pressed into the chip insertion socket 502 of the chip socket 406, each of the pins of the semiconductor chip 401 is electrically coupled to a corresponding one of the pads of a corresponding one of the socket interfaces 408A or 408B via the array of pogo pins. Three alignment holes 706 are provided along a diagonal between a corresponding three corners of each of the socket interfaces 408 for receiving corresponding ones of the alignment pins 508 in the assembled stacked configuration 1502. Also, four bolt holes 708 are provided along each of the diagonals towards the outer corners of each of the socket interfaces 408A and 408B for mounting the test card 404 and a corresponding pair of the chip sockets 406 to the docking plate 128 in the assembled configuration. A linear array of bolt holes 710 are provided on the test card 404 for mounting to the docking plate 128 as further described herein.

Figure 8:
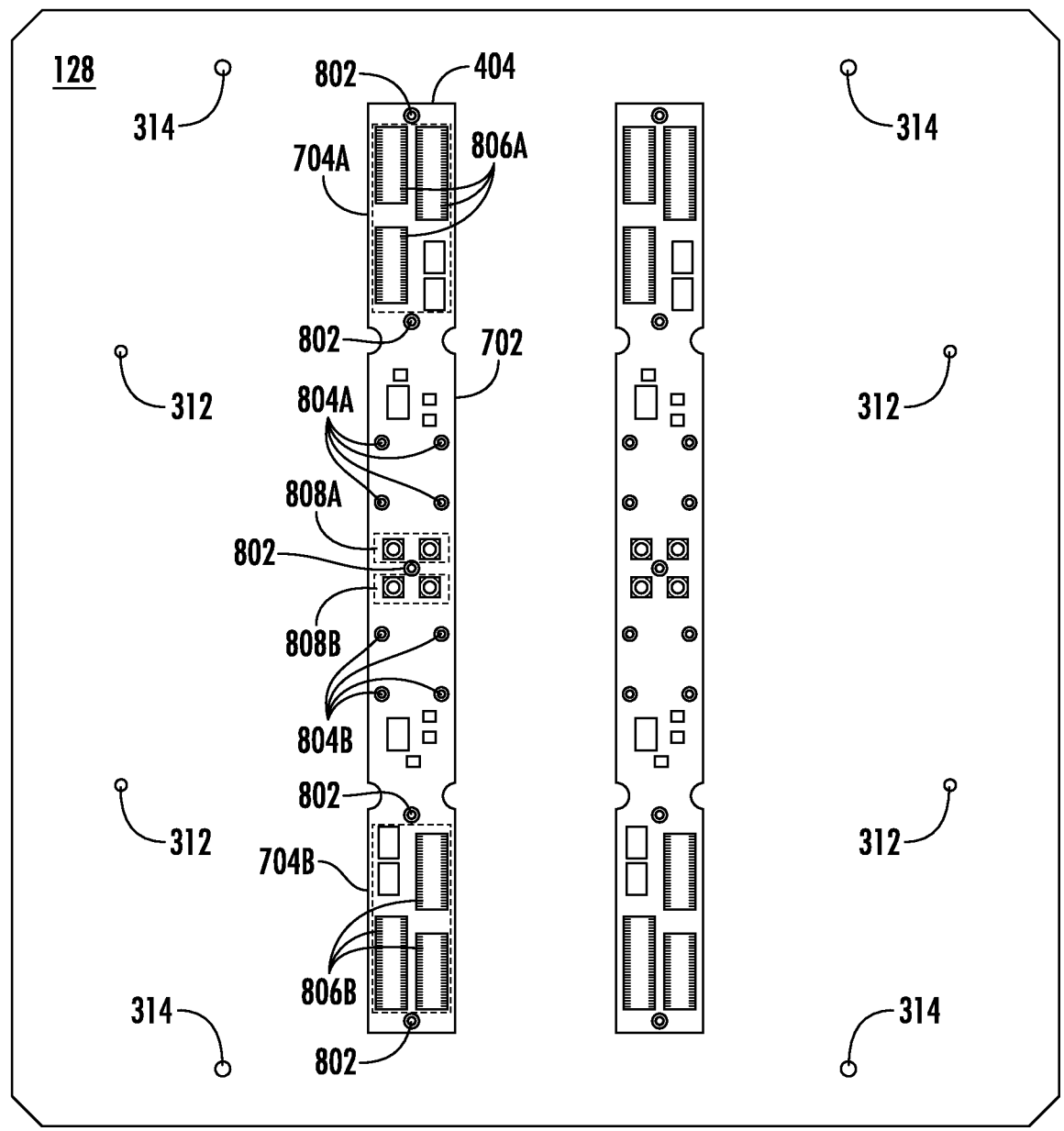
FIG. 8 is an orthogonal top view of the lower surface of the docking plate of FIG. 1 with two of the test cards mounted thereto illustrating lower surfaces of the test cards according to one embodiment of the present invention.

FIG. 8 is an orthogonal top view of the lower surface of the docking plate 128 with two of the test cards 404 mounted thereto illustrating lower surfaces of the test cards 404 according to one embodiment of the present invention. A linear array of bolts 802 are provided along the length of the test card 404, each inserted through the bolt holes 710 of the test card 404 and into the bolt holes 604 of the docking plate 128. In addition, for each test card 404, a first set of 4 bolts 804A are provided through the four bolt holes 708 of the socket interface 408A and through the four bolt holes 510 of the corresponding chip socket 406 and into the corresponding four bolt holes 516 of the docking plate 128. Similarly, a second set of 4 bolts 804B are provided through the four bolt holes 708 of the socket interface 408B and through the four bolt holes 510 of the corresponding chip socket 406 and into the corresponding four bolt holes 516 of the docking plate 128.

In order to achieve the assembled configuration shown in FIG. 8, the chip sockets 406 are inserted into the chip wells 514 formed at the lower surface of the docking plate 128 as shown in FIG. 6 in alignment with the corresponding test site openings 132, and then the test cards 404 are securely affixed to the docking plate 128 with the bolts 802, 804A and 804B so that the mounted chip sockets 406 are securely sandwiched or interposed between the test card 404 and the docking plate 128 at each of the test site openings 132. In the assembled configuration, the socket interfaces 408A and 408B of each of the test cards 404 are aligned with and electrically interfaced to the test card interfaces 602 of the corresponding chip sockets 406. It is noted that the upper surface of each of the test cards 404 is essentially flush with the lower surface of the docking plate 128 in the assembled configuration.

The first end section 704A of each test card 404 includes one or more arrays of electrical conductive pads 806A and the second end section 704B of each test card 404 also includes one or more arrays of electrical conductive pads 806B. The electrical conductive pads 806A are electrically coupled to the conductive pads of the socket interface 408A within the PCB of the test card 404, and the electrical conductive pads 806B are electrically coupled to the conductive pads of the socket interface 408B within the PCB of the test card 404. In addition, a first pair of radio frequency (RF) connectors 808A and a second pair of RF connectors 808B are mounted on the lower surface and in the middle of the center section 702 of each test card 404. The RF connectors 808A correspond with the socket interfaces 408A for one test site opening 132 and the RF connectors 808B correspond with the socket interfaces 408B of the other test site opening 132 of the pair of test site openings 132 handled by the test card 404. Each pair of RF connectors 808A and 808B includes an RF input and an RF output conveyed from the semiconductor chip 401 being tested through the chip interface 504, test card interface 602, and corresponding socket interface 408. In this manner, during testing, when each semiconductor chip 401 to be tested is plunged through one of the test site openings 132 and into the chip insertion socket 502 to electrically interface the chip interface 504 of a corresponding chip socket 406, each of the signals of the pins of the semiconductor chip 401 (all or a selected portion for test) are conveyed to the conductive pads 806 and RF connectors 808 (if and when the semiconductor chip 401 carries RF signals) provided on the lower surface of each test card 404.

The bolt holes 312 and alignment pins 314 are shown on the lower surface of the docking plate 128 for alignment with and mounting to the stiffener 126 as previously described.

Figure 9:
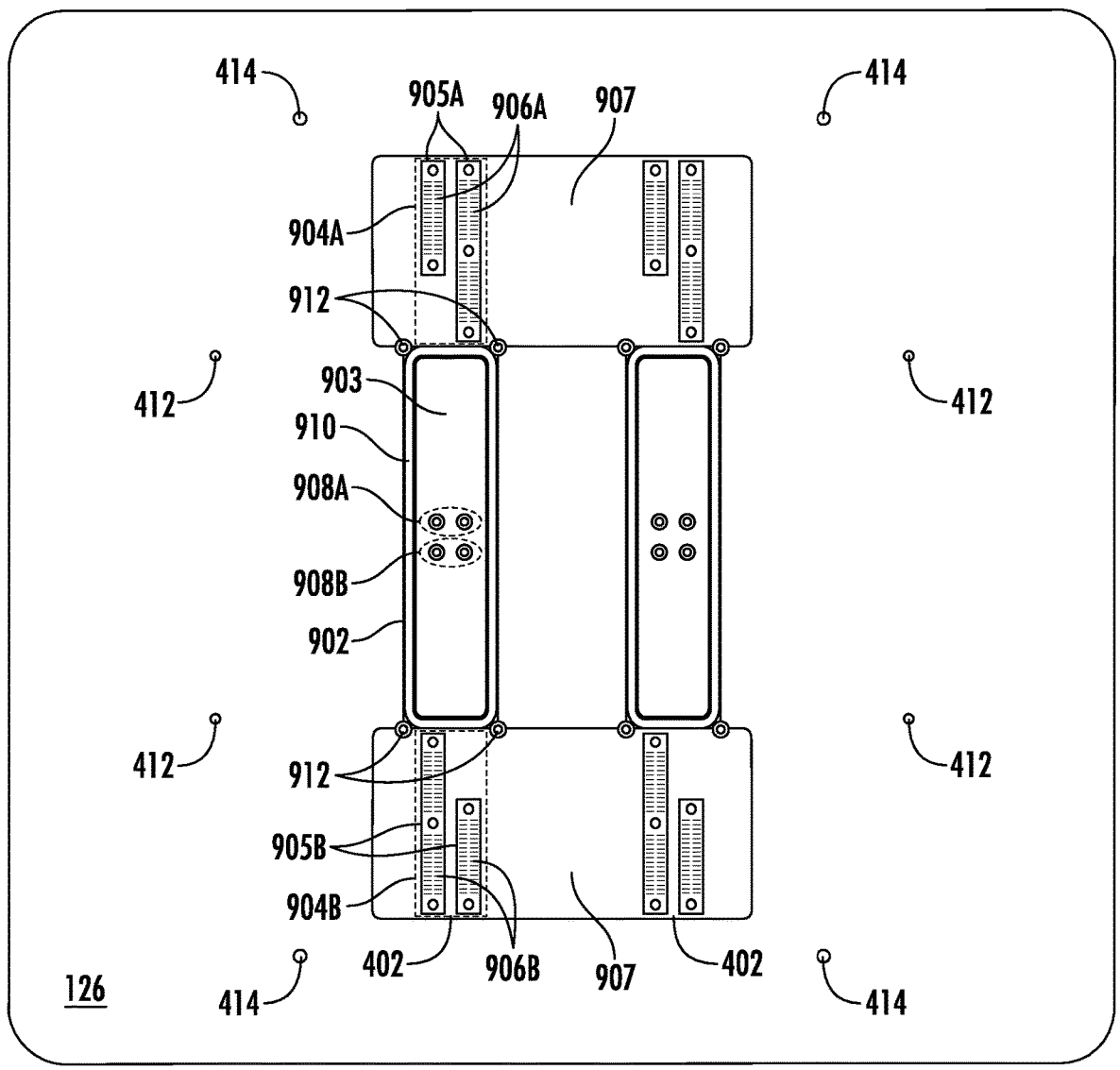
FIG. 9 is an orthogonal top view diagram of the upper surface of the stiffener showing more details of each of the pair of test interfaces for the 4X configuration according to one embodiment of the present invention.

FIG. 9 is an orthogonal top view of the upper surface of the stiffener 126 showing more details of each of the pair of test interfaces 402 for the 4X configuration according to one embodiment of the present invention. Each test interface 402 includes a center section 902 and two end sections 904A and 904B on either end of the center section 902. The center section 902 is separated from each of the two end sections 904A and 904B by a pair of alignment tabs 912 that align with the alignment notches 712 of a corresponding test card 404 in the assembled configuration. The first end section 904A of each test interface 402 includes one or more connectors 905A with one or more arrays of conductive pins 906A and the second end section 904B of each test interface 402 also includes one or more connectors 905B with one or more arrays of conductive pins 906B. The connectors 905A and 905B are mounted on the upper surface of a PCB 907, in which additional portions of the test electronics 1002 are mounted on the lower surface of the PCB 907 as further described herein. Only a portion of the PCB 907 is shown through openings of the stiffener 126. The center section 902 includes a well or basin 903 formed within the upper surface of the stiffener 126. In addition, a first pair of RF connectors 908A and a second pair of RF connectors 908B are mounted in the middle of the basin 903 of the center section 902 of each of the test interfaces 402. Also, a heat seal gasket 910 is provided along the upper surface of the stiffener 126 in the center section 902 surrounding the rim of the basin 903.

The docking plate 128 shown in FIG. 8 may be oriented lower surface down, then aligned with and mounted to the upper surface of the stiffener 126 of FIG. 9. The stiffener 126 includes the bolt holes 412 aligned with the bolt holes 312 of the docking plate 128. The multiple alignment holes 414 align with the alignment pins 314 of the docking plate 128. The bolts 420 are inserted into the holes 312 of the docking plate 128 and screwed into the corresponding holes 412 of the stiffener 126 to securely mount the docking plate 128 to the stiffener 126. Such mounting method is exemplary only and many other mounting methods may be used.

The test cards 404 mounted on the lower surface of the docking plate 128 are aligned with the test interfaces 402 of the stiffener 126 via the alignment notches 712 and the alignment pegs 912. It is noted that the test interfaces 402 are each formed below the upper surface of the stiffener 126, in which each of the test cards 404 are aligned with and inserted into a corresponding one of the test interfaces so that the lower surface of the docking plate 128 is mounted flush with the upper surface of the stiffener 126. When mounted, the RF connectors 808A and 808B mate with the corresponding RF connectors 908A and 908B, respectively, and the conductive pads 806A and 806B of each test card 404 aligns with and electrically couples to the conductive pins 906A and 906B, respectively, of the corresponding test interfaces 402. The mounting bolts 420 or the like may be used to securely mount the docking plate 128 to the stiffener 126. When mounted, the conductive pads 806A and 806B of the test cards 404 are pressed onto the conductive pins 906A and 906B, respectively, of the test interfaces 402 providing electrically conductive interfaces. In this manner, the electrical signals of the pins of each of the semiconductor chips 401 being tested are conveyed to the test interfaces 402 and ultimately to the test circuitry 1002 mounted on the lower surface of the stiffener 126 within the purge box 118.

When the docking plate 128 is mounted to the stiffener 126, the outer periphery of each of the lower surfaces of the center sections 702 of each of the test cards 404 physically interface a corresponding one of the heat seal gaskets 910 so that the corresponding basin 903 forms a cavity between the center section 702 of each test card 404 and the stiffener 126. The corresponding pair of chip sockets 406 are thus positioned directly above the basin 903 in the assembled configuration. As described further herein, the cavity of the basin 903 forms a thermal isolation barrier that thermally isolates the entire lower surface of the center section 702 of each of the test cards 404, and thus the lower surfaces of each of the chip sockets 406, from the internal space of the purge box 118. Stated another way, the basin 903 thermally isolates the lower surface of each test card 404 from the thermal conditions within the purge box 118, so that thermal testing of the semiconductor chips 401, such as when cooled or heated to excessive temperatures, is more efficient since each semiconductor chip 401 is isolated from the temperature conditions within the purge box 118 (which is usually ventilated and cooled via fans or the like to prevent excessive heating of the test circuitry 1002 therein).

Figure 10:
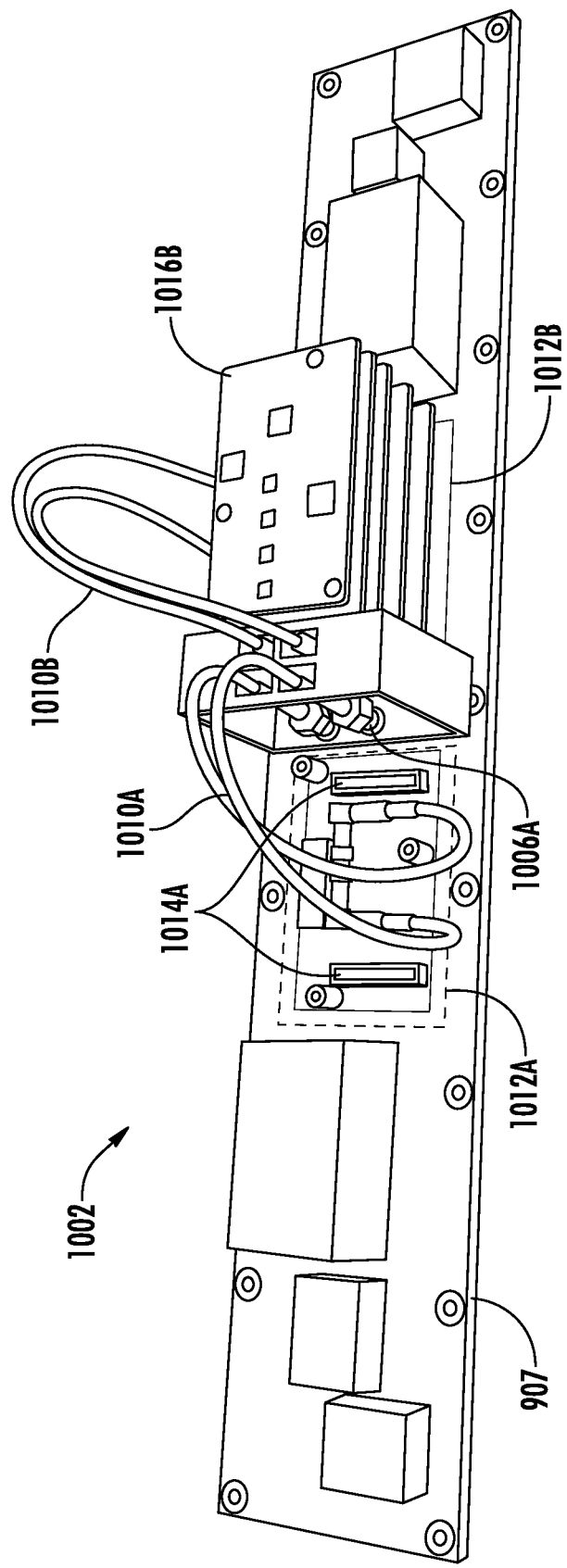
FIG. 10 is a perspective view of the test electronics mounted on a printed circuit board, which is further mounted on the lower surface of the stiffener and electrically interfaced with a corresponding one of the test interfaces according to one embodiment of the present invention.

FIG. 10 is a perspective view of the test electronics 1002 mounted on the lower surface of the PCB 907, which is further mounted on the lower surface of the stiffener 126 and electrically interfaced with a corresponding one of the test interfaces 402 according to one embodiment of the present invention. The PCB 907 extends the length of the test interface 402 and has connectors 1602A and 1602B (FIG. 16) electrically interfaced with the conductive pins 906A and 906B, respectively, at the ends of the test interface 402 through the stiffener 126. A first pair of RF connectors 1006A electrically interface the RF connectors 908A and a second pair of RF connectors 1006B (FIG. 16) electrically interface the RF connectors 908B. A pair of RF cables 1010A each have a first end configured to mate with a corresponding one of the RF connectors 1006A and a second end that is electrically mounted within a first test circuit area 1012A of the PCB 907. At least one test connector 1014A (two shown) is mounted to the PCB 907 within the test circuit area 1012A for receiving a first test circuit box (not shown). Another pair of RF cables 1010B each have a first end configured to mate with a corresponding one of the RF connectors interfacing the RF connectors 908B and a second end that is electrically mounted within a second test circuit area 1012B of the PCB 907. At least one test connector (not shown) is mounted to the PCB 907 within the test circuit area 1012B for receiving a second test circuit box 1016B.

Although not explicitly shown, it is understood that each of the test connectors mounted on the PCB 907 within the test circuit area 1012B for receiving the second test circuit box 1016B are substantially the same as the test connectors 1014A, and also that the first test box omitted from the figure is substantially the same as the second test circuit box 1016B. In this manner, the first test circuit box is configured to interface each of the electrical signals for testing a first one of the semiconductor chips 401 inserted into one of a pair of the test site openings 132 of the pair of test site openings 132 of a column 306, and the second test circuit box 1016B is configured to interface each of the electrical signals for testing a second one of the semiconductor chips 401 inserted into the other one of the pair of the test site openings 132 of the column 306. The entire configuration is repeated in substantially identical manner for interfacing and testing each pair of semiconductor chips 401 for each column 306 of the test site openings 132 for each of the 2X, 4X, 8X and 16X configurations. Each RF cable of the pairs of RF cables 1010A and 1010B have a uniform length so that they may be electrically coupled to any location within the corresponding test circuit areas 1012A and 1012B without changing the characteristics of the RF signals even if the location and spacing of the sites change.

Figure 11:
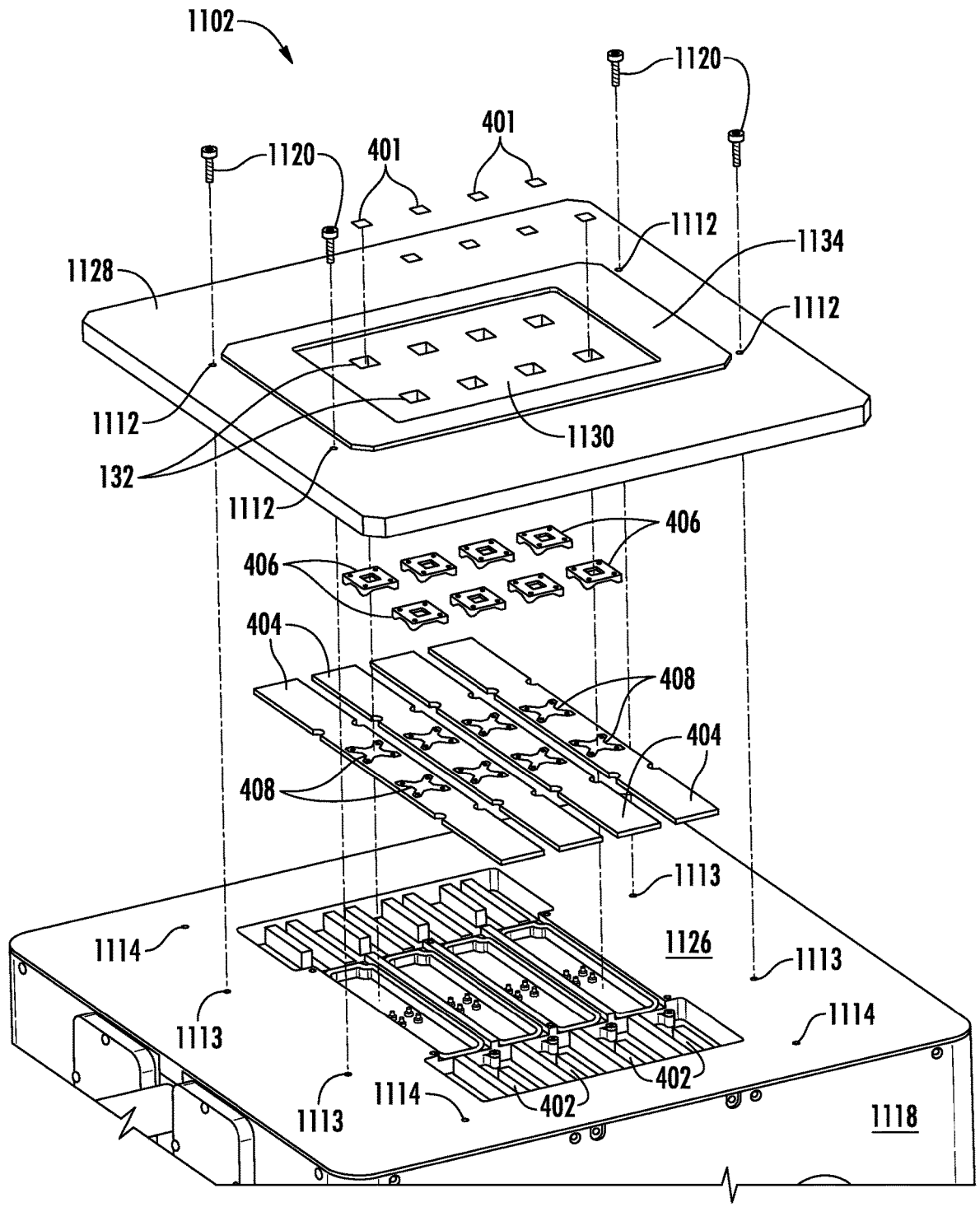
FIG. 11 is an exploded perspective view illustrating construction of a test head between a docking plate and a stiffener for the 8X configuration with 8 test site openings according to one embodiment of the present invention for testing up to 8 of the same semiconductor chips.

FIG. 11 is an exploded perspective view illustrating construction of a test head 1102 between a docking plate 1128 and a stiffener 1126 for the 8X configuration with 8 test site openings 132 according to one embodiment of the present invention for testing up to 8 of the same semiconductor chips 401. The 8X configuration is similar to the 4X configuration, except modified for testing up to 8 semiconductor chips 401 at a time using the 8X handler rather than the 4X handler 202. Thus, the docking plate 1128 is similar to the docking plate 128, except including 8 test site openings 132 for receiving up to 8 of the semiconductor chips 401. The two rows 304 of the test site openings 132 are separated by the same uniform distance UD as the 4X configuration. The four columns 306, however, are spaced apart from each other by a handler specific distance HD8 suitable for the 8X handler. The array of 8 test site openings 132 are provided within a test area 1130 which is similar to the test area 130, except extended within an extended elevated platform 1134 to facilitate a larger number of the test site openings 132 for interfacing the 8X handler. The stiffener 1126 mounted at the top of the purge box 118 is substantially similar to the stiffener 126, except configured with 4 test interfaces 402 suitable for the 8X configuration rather than only 2 test interfaces 402 for the 4X configuration. Each of the 4 test interfaces 402 configured on the stiffener 1126 are essentially the same as that described for the 4X configuration, except spaced apart from each other by the handler specific distance HD8. Bolts 1120, docking plate bolt holes 1112, stiffener bolt holes 1113 and alignment holes 1114 may be provided in similar manner as that shown in FIG. 4.

Figure 12:
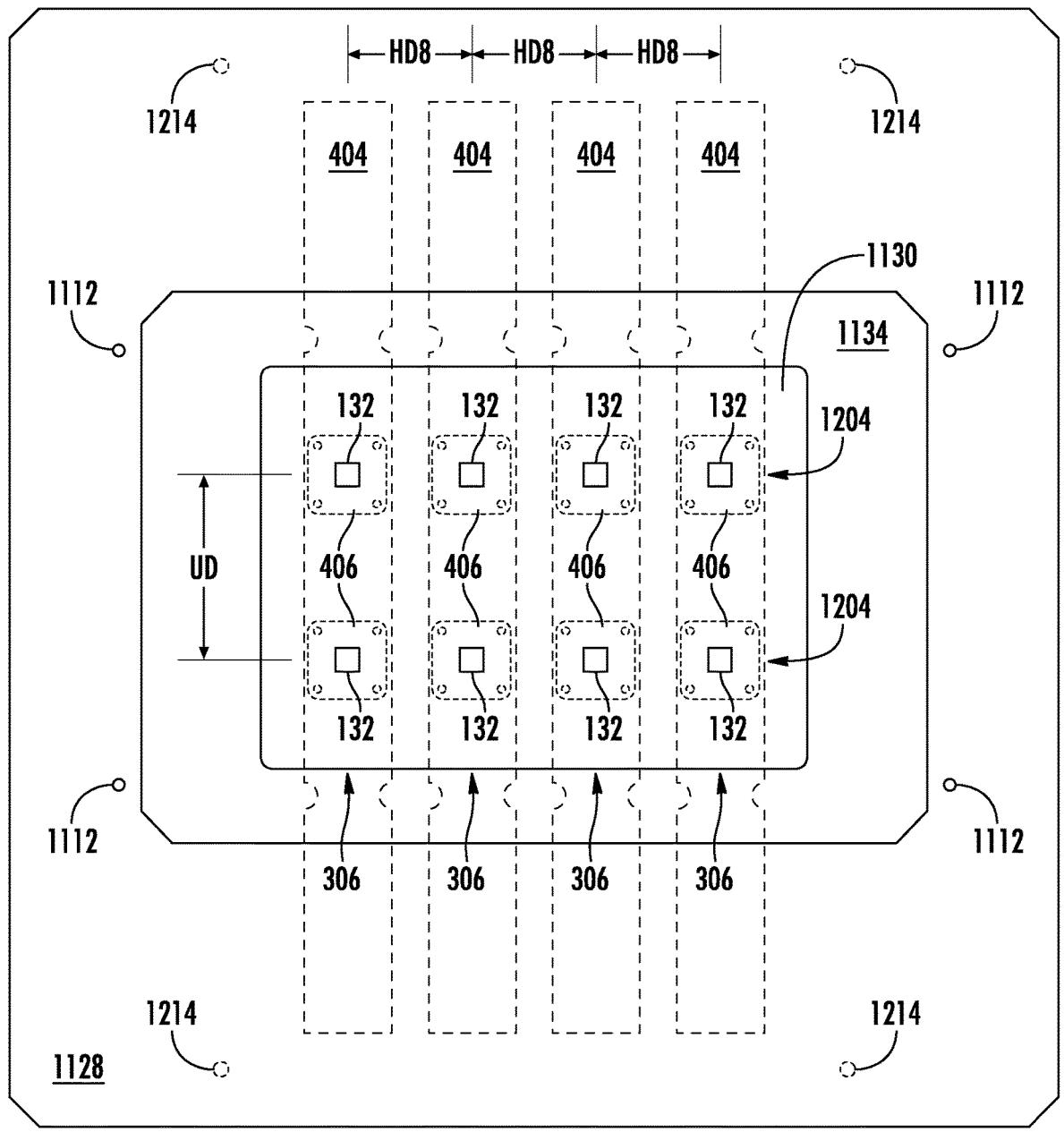
FIG. 12 is an orthogonal top view diagram of the docking plate of FIG. 11 for the 8X configuration according to one embodiment of the present invention.

FIG. 12 is an orthogonal top view diagram of the docking plate 1128 for the 8X configuration according to one embodiment of the present invention. The docking plate 1128 includes the array of 8 test site openings 132 organized as two rows 1204 and four columns 306 within the test area 1130, which is within the elevated platform 1134. In a similar manner as described for the docking plate 128, the rows 1204 are aligned with each other and spaced apart by the uniform distance UD suitable for multiple handlers. Each row 1204 of the 8X configuration is substantially the same as the rows 304 of the 4X configuration, except including twice the number of test site openings 132. Each column 306 is essentially identical to that previously described for the 4X configuration, except that there are twice the number of columns 306 spaced apart from each other by a handler specific column distance HD8 for the 8X configuration. Each column 306 is configured in a substantially identical manner as each column of the 4X configuration. Bolt holes 1112 are shown that align with bolt holes 1113 of the stiffener 1126, and alignment pins 1214 are provided on the lower surface of the docking plate 1128 for insertion into the alignment holes 1114.

Figure 13:
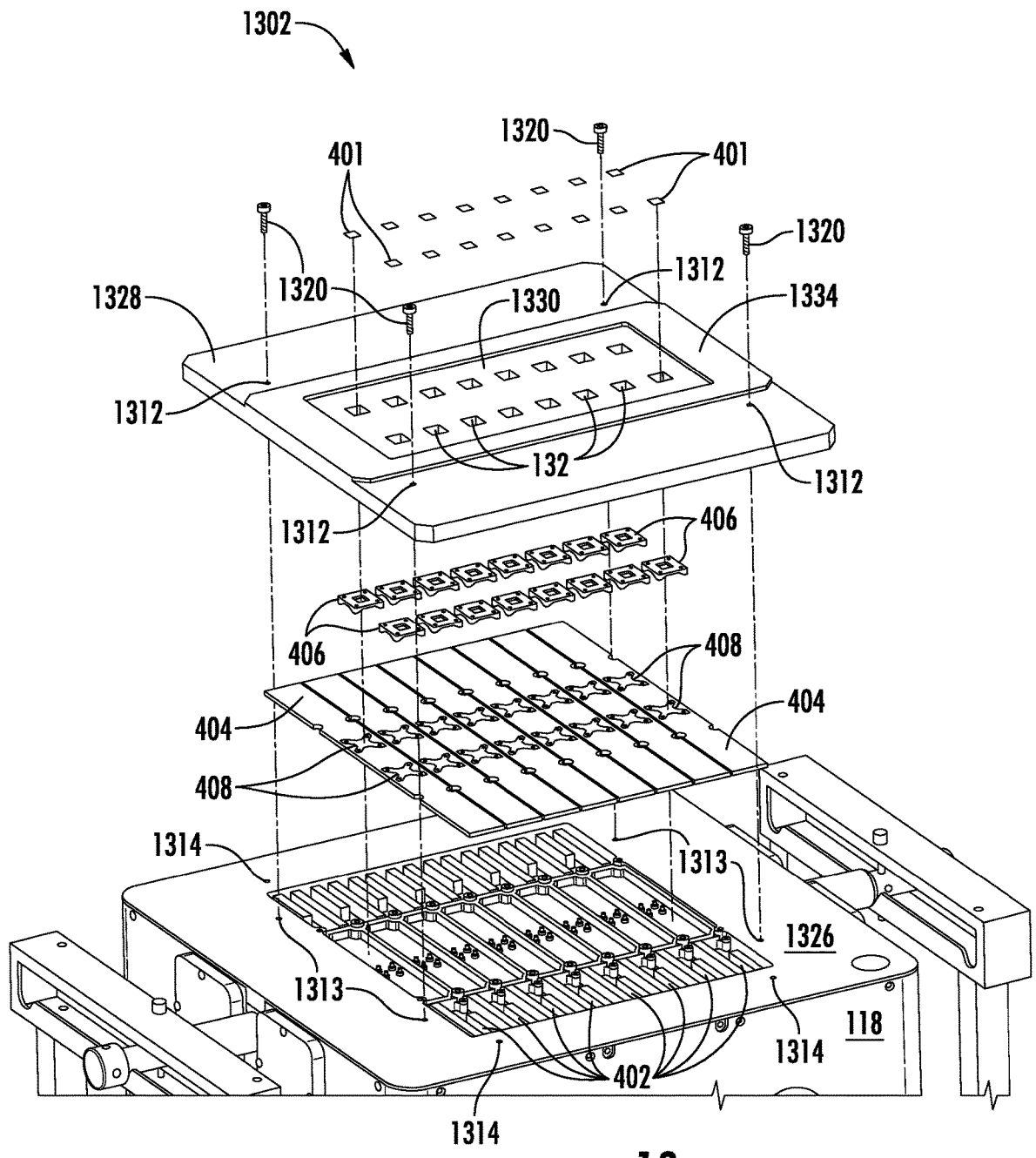
FIG. 13 is an exploded perspective view illustrating construction of a test head between a docking plate and a stiffener for the 16X configuration with 16 test site openings according to one embodiment of the present invention for testing up to 16 of the same semiconductor chips.

FIG. 13 is an exploded perspective view illustrating construction of a test head 1302 between a docking plate 1328 and a stiffener 1326 for the 16X configuration with 16 test site openings 132 according to one embodiment of the present invention for testing up to 16 of the same semiconductor chips 401. The 16X configuration is similar to the 4X and 8X configurations, except modified for testing up to 16 of the semiconductor chips 401 at a time using the 16X handler. Again, the docking plate 1328 is similar to the docking plate 1128, except including 16 test site openings 132 for receiving up to 16 of the semiconductor chips 401. The two rows 304 of the test site openings 130 are separated by the same uniform distance UD as for the 4X and 8X configurations. The eight columns 306, however, are spaced apart from each other by a handler specific distance HD16 suitable for the 16X handler. The array of 16 test site openings 132 are provided within a test area 1330 which is similar to the test area 130 or 1130, except extended within an extended elevated platform 1334 to facilitate a larger number of the test site openings 132 for interfacing the 16X handler. The stiffener 1326 mounted at the top of the purge box 118 is substantially similar to the stiffener 1126, except configured with 8 test interfaces 402 suitable for the 16X configuration rather than only 2 or 4 test interfaces 402 for the 4X or 8X configurations. Each of the 8 test interfaces 402 configured on the stiffener 1326 is essentially the same as that described for the 4X or 8X configurations, except spaced apart from each other by a handler specific distance HD16 suitable for the 16X handler. Bolts 1320, docking plate bolt holes 1312, stiffener bolt holes 1313 and alignment holes 1314 may be provided in similar manner as that shown in FIG. 4.

Figure 14:
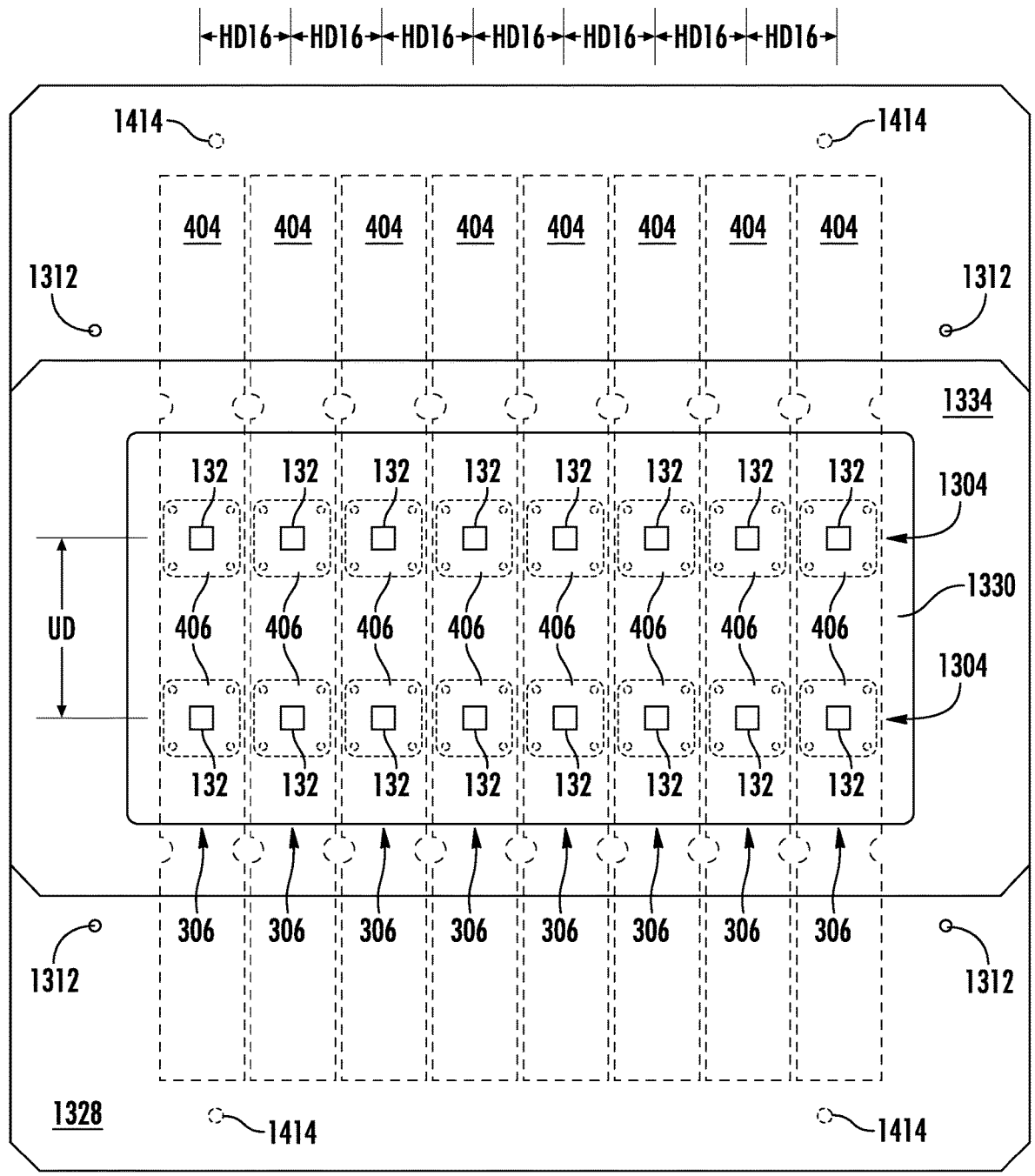
FIG. 14 is an orthogonal top view diagram of the docking plate of FIG. 13 for the 16X configuration according to one embodiment of the present invention.

FIG. 14 is an orthogonal top view diagram of the docking plate 1328 for the 16X configuration according to one embodiment of the present invention. The docking plate 1328 includes an array of 16 test site openings 132 organized as two rows 1304 and eight columns 306 of test site openings 132 within the test area 1330, which is within the elevated platform 1334. In a similar manner as described for the docking plate 1128, the rows 1304 are aligned with each other and spaced apart by the uniform distance UD suitable for multiple handlers. Each row 1304 of the 16X configuration is substantially the same as the rows 304 of the 8X configuration, except including twice the number of test site openings 132. Each column 306 is essentially identical to that previously described for the 8X configuration, except that there are twice the number of columns 306 spaced apart from each other by a handler specific column distance HD16 for the 16X configuration. Each column 306 is configured in a substantially identical manner as each column of the 4X and 8X configurations. Bolt holes 1112 are shown that align with bolt holes 1313 of the stiffener 1326, and alignment pins 1414 are provided on the lower surface of the docking plate 1328 for insertion into the alignment holes 1314.

The test heads 102, 1102 and 1302 are each configured for testing copies of the same semiconductor chip (e.g., the semiconductor chips 401 of the same type), except that the test head 102 tests up to 4 chips at a time, the test head 1102 tests up to 8 chips at a time, and the test head 1302 tests up to 16 chips at a time. The purge box 118 is substantially identical for each configuration, except that the stiffener 126 is used for the test head 102, the stiffener 1126 is used for the test head 1102, and the stiffener 1326 is used for the test head 1302. The stiffeners 126, 1126 and 1326 are similar to each other, except implemented with a different number of the substantially identical test interfaces 402. The docking plates 128, 1128, and 1328 are similar to each other, except implemented with a different number of the test site openings 132 for interfacing a corresponding one of the different handlers for testing a corresponding number of the semiconductor chips 401.

Each of the chip sockets 406 are substantially identical for each of the different configurations (2X, 4X, 8X, 16X), in which the only difference between the different configurations is the number of chip sockets used. Each of the test cards 404 in each of the different configurations are identical to each other in that each is configured according to a "uniform" card configuration, in which the only difference between the different configurations is the number of test cards included. The term "uniform" is defined to mean substantially identical and interchangeable. Each of the test interfaces 402 in each of the different configurations are identical to each other in that each is configured according to a uniform interface configuration, in which the only difference between the different configurations is the number of test interfaces included. The test electronics 1002 in each column of the different configurations are identical to each other, in which the only difference between the different configurations is the number of test electronics included within the purge box 118.

When a new semiconductor chip (not shown) is fabricated, a new test card (e.g., the test card 404) and new test electronics (e.g., test electronics 1002) are designed and fabricated for purposes of testing the new semiconductor chip. Once fabricated, the new test cards and test electronics may be used for each of the 2X, 4X, 8X, and 16X configurations. The docking plates 128, 1128 and 1328 may also be used if the new semiconductor chip has substantially the same size and shape. Otherwise, new docking plates are fabricated. A new chip socket may be needed only when the input/output (I/O) pin pattern of the new chip is different. The test interfaces 402 may be used as long as the conductive pins 906A and 906B and/or the RF connectors 908A and 908B are sufficient for the new chip. If the test interface 402 is suitable, then the stiffeners 126, 1126 and 1326 may be used for the new chip. The purge box 118 may be used for the new chip.

FIG. 15 is a conceptual and partial perspective view of the stacked configuration 1502 implemented according to one embodiment of the present invention, which includes the docking plate 128, a corresponding one of the chip sockets 406, and one of the test cards 404 mounted to a corresponding one of the test interfaces 402 of the stiffener 126. Also shown is a chip 401 that has been inserted or plunged into a corresponding one of the test site openings 132 by an arm 1504 of the 4X handler 202 for testing the chip 401. The docking plate 128, the chip socket 406, the arm 1504, and the test card 404 are shown in phantom to more clearly illustrate the effect of the plunged chip 401 on the stacked configuration 1502. The downward force of the arm 1504 presses the chip 401 onto the chip socket 406 pressing on the socket interface 408 of the test card 404. The plunge force is not, however, applied to the electrical conductive pads 806A and 806B or the conductive pins 906A and 906B. The outer periphery of the test card 404 is fully supported by the stiffener 126 at the outer periphery of the test interface 402 effectively providing a hard stop, so that the test card 404 receives compression force and thus does not move and remains substantially undeformed. Also, as shown in FIG. 8, the set of bolts 804A and 804B securely mount the test card 404 to the docking plate 128 which is then securely mounted to the stiffener 126 by the bolts 420, so that the plunge force is ultimately distributed to the stiffener 126. Furthermore, the pads/pins 806A/B and 906A/B are offset from the test site openings 132 into which the semiconductor chips 401 are plunged and thus are not directly aligned with the arm 1504 applying the plunge force. The plunge force, therefore, has only negligible effect on the electrical conductive pads 806A and 806B and the conductive pins 906A and 906B providing a more robust configuration.

Figure 16:
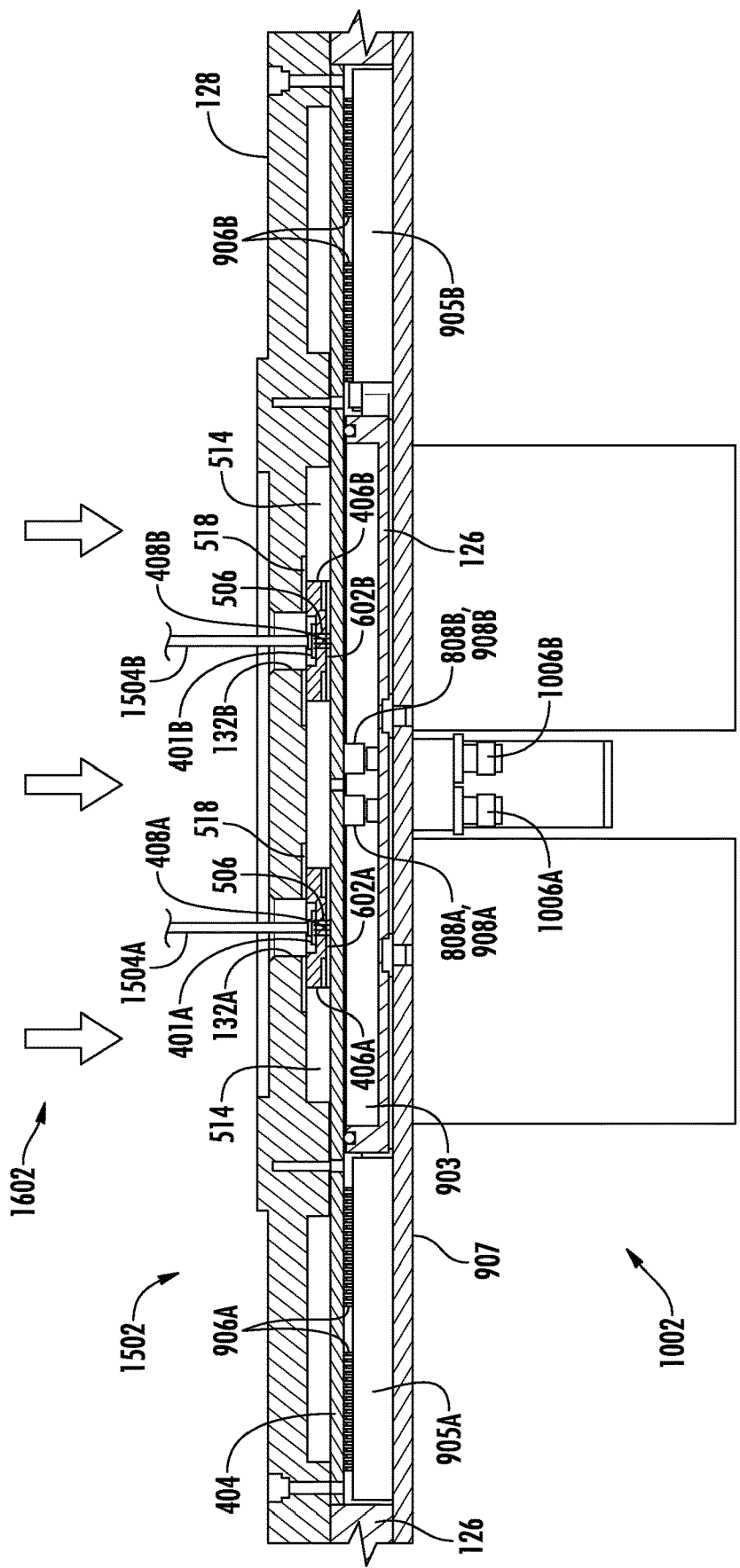
FIG. 16 is a simplified sectional side view of the stacked configuration of FIG. 15 according to one embodiment of the present invention.

FIG. 16 is a simplified sectional side view of the stacked configuration 1502 according to one embodiment of the present invention. Some details are omitted so that significant components may more clearly illustrated, including, for example, the test electronics 1002 mounted via the PCB 907 at the lower surface of the stiffener 126 are substantially simplified. As previously described, in the stacked configuration 1502 a pair of the chip sockets 406, shown as chip sockets 406A and 406B, are sandwiched between the docking plate 128 and the test card 404, and the test card 404 is sandwiched between the docking plate 128 and the stiffener 126. A first handler arm 1504A has plunged a first chip 401A into a first test site opening 132A and a second handler arm 1504B has plunged a second chip 401B into a second test site opening 132B of the test card 404. A test card interface 602A on the lower surface of the first chip socket 406A interfaces the first socket interface 408A on the upper surface of the test card 404, and a test card interface 602B on the lower surface of the second chip socket 406B interfaces the second socket interface 408B on the upper surface of the test card 404. Also, the conductive pins 906A and 906B of the connectors 905A and 905B, respectively, are shown physically interfacing the lower surface of the test card 404 to electrically couple to the electrical conductive pads 806A and 806B (not shown in FIG. 16). The conductive pins 906A and 906B are routed on the PCB 907 to convey the signals of each semiconductor chip 401A and 401B, respectively, to the test electronics 1002. Furthermore, the RF connectors 808A and 808B of the test card 404 mate with the corresponding RF connectors 908A and 908B, respectively, of the corresponding test interface 402, and the RF connectors 908A and 908B are electrically coupled to the RF connectors 1006A and 1006B, respectively, of the test electronics 1002.

A set of arrows 1602 illustrate application of a temperature variant, such as application of heat and/or cold to a specified test temperature. The chips 401A and 401B may be preheated or precooled to the appropriate temperature prior to being plunged into the test site openings 132A and 132B. The ventilation channels 518 formed in the socket wells 514 allow communication of applied temperature from the test site openings 132A and 132B around the chip sockets 406A and 406B and into the corresponding chip insertion sockets 502 so that the chips 401A, 401B remain at the test temperature. Also, the ventilation holes 506 of the chip sockets 406A, 406B allow communication of the applied temperature in and around each of the chips 401A, 401B. In many conventional configurations, the test electronics (e.g., the test electronics 1002) were mounted on the lower side of the test PCB and/or stiffener providing a temperature gradient that tended to change the temperature of the DUTs (e.g., the chips 401A and 401B). In the illustrated configuration, however, the basin 903 formed as part of the test interface 402 on the upper surface of the stiffener 126 provides a thermal isolation barrier between the lower surfaces of the center section 702 of the test cards 404 and the test electronics 1002. The test electronics 1002, for example, are cooled within the purge box 118 and would otherwise draw heat away from the test card 404 and the chips 401A, 401B when being tested at an upper temperature level. Instead, the chips 401A, 401B are thermally isolated from the test electronics 1002, so that the chips 401A, 401B may be heated or cooled to any desired test temperature while the test electronics 1002 remain appropriately cooled during test procedures.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:
1. A test system for testing a plurality of semiconductor chips, comprising:
 a docking plate having an upper surface, a lower surface and a plurality of test site openings arranged as an array of at least one row and M columns of test site openings, each said test site opening for receiving a corresponding one of the plurality of semiconductor chips for testing;

M test cards, each having a uniform card configuration that may be used with any of a plurality of different handlers, each having an upper surface physically interfacing said lower surface of said docket plate and being aligned with a corresponding one of said M columns, wherein said upper surface comprises at least one socket interface aligned with a corresponding one of said at least one row of test site openings, and each having a lower surface comprising a plurality of conductive pads electrically coupled to and longitudinally offset from each of said at least one socket interface along a length of said each test card;

a plurality of chip sockets, each interposed between said docking plate and a corresponding one of said M test cards for electrically coupling pads of one of the plurality of semiconductor chips to a corresponding one of said at least one socket interface of said corresponding test card;

a stiffener having an upper surface comprising M test interfaces and having a lower surface, wherein each of said plurality of test interfaces comprises a plurality of conductive pins for electrically interfacing said conductive pads of a corresponding one of said plurality of test cards; and test electronics mounted at said lower surface of said stiffener and electrically interfacing said plurality of conductive pins for enabling electrical communication with each of the plurality of semiconductor chips.

2. The test system of claim 1, wherein said M columns are separated by a handler specific distance that is unique for each of a plurality of handlers, and wherein each of said M test cards have a uniform configuration that may be used within a test system configured for any of said plurality of handers for testing a given semiconductor chip configuration.

3. The test system of claim 2, wherein said at least one row comprises two rows separated by a uniform distance that is common to each of a plurality of handlers including a 4X handler, an 8X handler, and a 16X handler, wherein said M columns comprises two columns separated from each by a first handler specific distance for a 4X configuration for interfacing said 4X handler, wherein said M columns comprises four columns separated from each other by a second handler specific distance for an 8X configuration for interfacing said 8X handler, and wherein said M columns comprises eight columns separated from each other by a third handler specific distance for a 16X configuration for interfacing said 16X handler.

4. The test system of claim 1, wherein said lower surface of each of said plurality of test cards physically interfaces at least a portion of said upper surface of said stiffener so that when each of the plurality of semiconductor chips is pressed into a corresponding one of said plurality of chip sockets to correspondingly press against said upper surface of each of said plurality of test cards, said each of said plurality of test cards is supported by said stiffener and remains undeformed.

5. The test system of claim 1, wherein:

each of said M test cards comprises a printed circuit board including a center section and first and second end sections integrally mounted on either end of said center section, and wherein said at least one socket interface comprises first and second socket interfaces provided in said center section along said upper surface of said corresponding test card; and wherein said plurality of conductive pads comprises a first set of conductive pads provided on a lower surface of said first end section electrically coupled to said first socket interface and a second set of conductive pads provided on a lower surface of said second end section electrically coupled to said second socket interface.

6. The test system of claim 1, wherein:

each of said M test cards comprises a printed circuit board including a center section and first and second end sections integrally mounted on either end of said center section, and wherein said at least one socket interface comprises first and second socket interfaces provided in said center section an said upper surface of said corresponding test card;

wherein each of said M test interfaces of said stiffener comprises a center section and first and second end sections positioned on either end of said center section, and wherein a corresponding one of M basins is formed on said upper surface of said stiffener within said center section of each of said M test interfaces; and wherein said center section of each of said M test cards covers said basin of a corresponding one of said M test interfaces so that each said basin forms a thermal isolation cavity.

7. The test system of claim 6, further comprising a plurality of heat seal gaskets, each mounted within said center section of a corresponding one of said M test interfaces of said stiffener surrounding a corresponding one of said M basins and interfacing said lower surface of a corresponding one of said M test cards.

8. The test system of claim 6, wherein each of said M test cards has a width that is greater than a width of said M basins so that a lower surface of said center section of each of said M test cards is physically supported by at least a portion of said stiffener at a periphery of a corresponding one of said M basins so that each of said M test cards remain substantially undeformed when the plurality of semiconductor chips are plunged into said test site openings.

9. The test system of claim 1, further comprising:

each of said M test cards comprising a printed circuit board including a center section and first and second end sections integrally mounted on either end of said center section;

at least one radio frequency connector mounted near a middle of said center section of each of said M test cards and electrically coupled to said at least one socket interface;

wherein each of said M test interfaces of said stiffener comprises a center section and first and second end sections positioned on either end of said center section, and wherein a corresponding one of M basins is formed on said upper surface of said stiffener within said center section of each of said M test interfaces; and at least one radio frequency connector mounted within a corresponding one of said M basins near a middle of said center section of a corresponding one of said M test interfaces that is mated with said at least one radio frequency connector of said corresponding test card.

10. The test system of claim 1, further comprising each of said M test cards comprises a printed circuit board including a center section and first and second end sections integrally mounted on either end of said center section, and wherein said at least one socket interface comprises first and second socket interfaces provided in said center section an said upper surface of said corresponding test card;

a first radio frequency connector pair mounted near a middle of said center section of each of said M test cards and electrically coupled to said first socket interface, and a second radio frequency connector pair mounted near said middle of said center section of each of said M test cards and electrically coupled to said second socket interface;

wherein each of said M test interfaces of said stiffener comprises a center section and first and second end sections positioned on either end of said center section; and a first radio frequency connector pair mounted near a middle of said center section of each of said M test interfaces that is mated with said first radio frequency connector pair of said corresponding test card, and a second radio frequency connector pair mounted near said middle of said center section of each of said M test interfaces that is mated with said second radio frequency connector pair of said corresponding test card.

11. A test head for testing at least one semiconductor chip received from a selected one of a plurality of different handlers, comprising:
  a purge box;
  a stacked configuration, comprising:
    a stiffener forming one side of said purge box, said stiffener having an upper surface and a lower surface, wherein said upper surface comprises a test interface including a plurality of conductive pins, and wherein said test interface has a uniform interface configuration that is the same for any of the plurality of different handlers;
    a test card having a uniform card configuration that may be used with any of the plurality of different handlers, said test card having an upper surface including a socket interface and having a lower surface comprising a plurality of conductive pads electrically coupled to said socket interface and physically and electrically interfaced with said plurality of conductive pins of said stiffener;
    wherein said socket interface and said plurality of conductive pads of said test card are longitudinally offset from each other along a length of said test card;
    a docking plate having an upper surface for interfacing the selected handler, having a lower surface for interfacing said upper surface of said test card interposed between said docking plate and said stiffener, and having a test opening for receiving said one of the at least one semiconductor chip for testing; and
    a chip socket interposed between said docking plate and said test card for electrically coupling pins of said one of the at least one semiconductor chip to said socket interface of said test card; and
  test electronics mounted to said lower surface of said stiffener within said purge box and electrically interfaced with said conductive pins for communicating with said one of the at least one semiconductor chip.

12. The test had of claim 11, wherein:
  said docking plate has a plurality of test openings that are arranged into M columns of test openings, wherein M is unique so that said M columns are separated by a handler specific distance that is unique for each of the plurality of handlers; and
  wherein said stacked configuration comprises M test cards including one for each of said M columns, wherein each of said M test cards has said uniform card configuration that may be used within said stacked configuration configured for any of said plurality of handlers.

13. The test head of claim 12, wherein said M columns comprises two columns separated from each other by a first handler specific distance for a 4X configuration for interfacing a 4X handler, wherein said M columns comprises four columns separated from each other by a second handler specific distance for an 8X configuration for interfacing an 8X handler, and wherein said M columns comprises eight columns separated from each other by a third handler specific distance for a 16X configuration for interfacing a 16X handler.

14. The test head of claim 11, wherein said lower surface of said test card physically interfaces at least a portion of said upper surface of said stiffener so that when the semiconductor chip is pressed into said chip socket to correspondingly press against said upper surface of said test card, said test card is supported by said stiffener and remains substantially undeformed.

15. The test head of claim 11, wherein:
  said test card comprises a printed circuit board including a center section and first and second end sections, and wherein said socket interface comprises first and second socket interfaces provided within said center section of said test card; and
  wherein said plurality of conductive pads comprises a first set of conductive pads provided on a lower surface of said first end section electrically coupled to said first socket interface and a second set of conductive pads provided on a lower surface of said second end section electrically coupled to said second socket interface.

16. The test head of claim 11, wherein:
  said test card comprises a printed circuit board including a center section and first and second end sections, and wherein said socket interface comprises first and second socket interfaces provided within said center section of said test card;
  wherein said test interface comprises a interface including a center section and a pair of end sections, and wherein a basin is formed on said upper surface within said center section of said test interface; and
  wherein said center section of said test card covers said basin to form a thermal isolation cavity between said test electronics and said lower surface of said test card.

17. The test head of claim 16, further comprising a heat seal gasket provided on said upper surface of said stiffener surrounding said basin and physically interfaced with said lower surface of said test card to thermally seal said thermal isolation cavity.

18. The test head of claim 16, wherein said test card has a width that is greater than a width of said basin so that a lower surface of said center section of test card physically interfaces at least a portion of said upper surface of said stiffener surrounding said basin so that when the semiconductor chip is pressed into said chip socket, said test card is supported by said stiffener and remains substantially undeformed.

19. The test head of claim 11, further comprising:
  a lower surface of each of said pair of end sections of said test card comprises said plurality of conductive pads that are electrically coupled to said socket interface of said test card; and
  wherein an upper surface each of said end sections of said test interface comprises a plurality of test conductors that electrically interface said conductive pads of said test card.

20. The test head of claim 11, further comprising:
said test card comprising a printed circuit board including a center section and first and second end sections;
at least one radio frequency connector mounted near a middle of said center section of said test card and electrically coupled to said at least one socket interface;
wherein said test interface comprises a center section and first and second end sections, wherein a basin is formed on said upper surface of said stiffener within said center section of said test interface; and
at least one radio frequency connector mounted within said basin near a middle of said center section of said test interface that is mated with said at least one radio frequency connector of said test card.

* * * * *